(12) United States Patent
Sendai et al.

(10) Patent No.: US 6,660,139 B1
(45) Date of Patent: Dec. 9, 2003

(54) PLATING APPARATUS AND METHOD

(75) Inventors: Satoshi Sendai, Tokyo (JP); Kenya Tomioka, Tokyo (JP); Katsumi Tsuda, Tokyo (JP); Naomitsu Ozawa, Kohza-gun (JP)

(73) Assignee: Ebara Corporation, Tokyo (JP)

( * ) Notice: Subject to any disclaimer, the term of this patent is extended or adjusted under 35 U.S.C. 154(b) by 98 days.

(21) Appl. No.: 09/706,756

(22) Filed: Nov. 7, 2000

(30) Foreign Application Priority Data

Nov. 8, 1999  (JP) .......................................... 11-316767
May 17, 2000  (JP) ...................................... 2000-145682

(51) Int. Cl.[7] .............................. C25D 17/06; B05C 3/00
(52) U.S. Cl. ................... 204/297.01; 118/428; 118/429
(58) Field of Search ............................. 204/286, 224 R, 204/212, 297.01; 118/423, 429, 428

(56) References Cited

U.S. PATENT DOCUMENTS 6,258,220 B1 * 7/2001 Dordi et al. ................ 204/198

6,294,059 B1   9/2001 Hongo et al.

\* cited by examiner

*Primary Examiner*—Donald R. Valentine
(74) *Attorney, Agent, or Firm*—Wenderoth, Lind & Ponack, L.L.P.

(57) ABSTRACT

A plating apparatus continuously plates a surface of a substrate with metal and performs its supplementary process in one housing unit. The plating apparatus comprises a cassette stage for placing a substrate cassette thereon, a pre-treatment unit for pre-treating a surface of a substrate, and a plating unit for plating a surface of the substrate pre-treated in the pre-treatment unit. The plating apparatus further comprises a first substrate stage disposed between the cassette stage and the pre-treatment unit, a cleaning and drying unit disposed between the cassette stage and the first substrate stage, a first transfer device, and a second transfer device. The first transfer device transfers a substrate between the substrate cassette, the cleaning and drying unit, and the first substrate stage. The second transfer device transfers a substrate between the first substrate stage, the pre-treatment unit, and the plating unit.

10 Claims, 27 Drawing Sheets

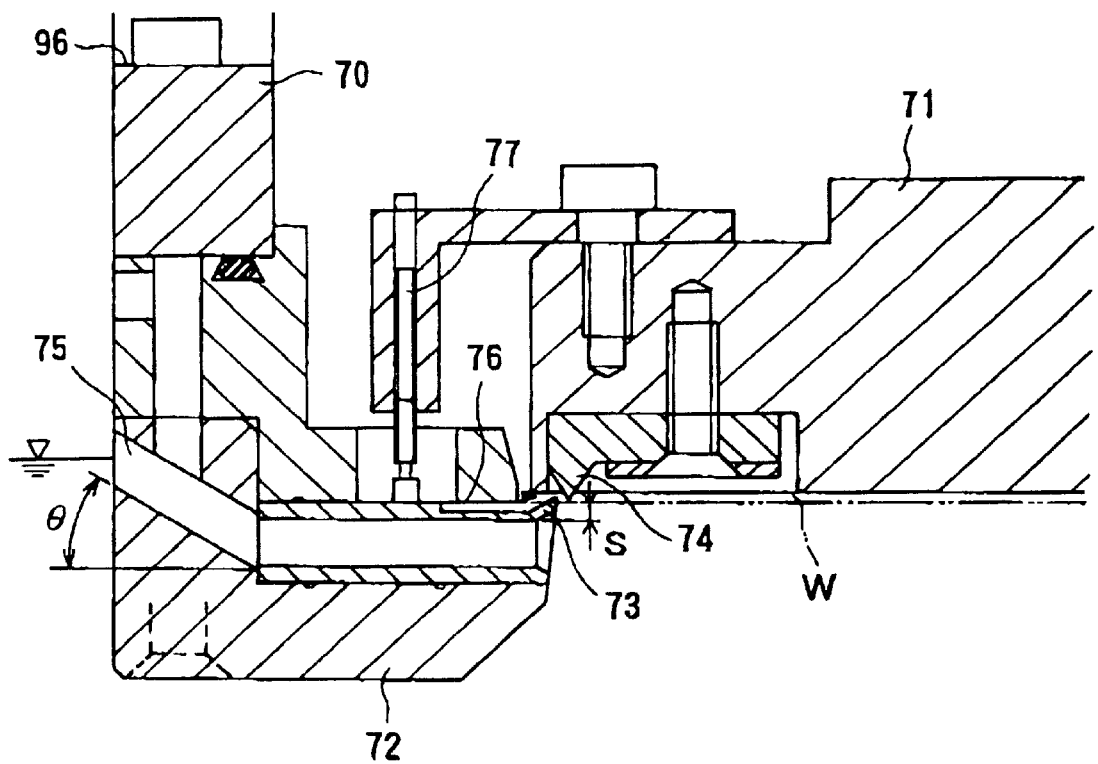
F I G. 5

F I G. 1 3
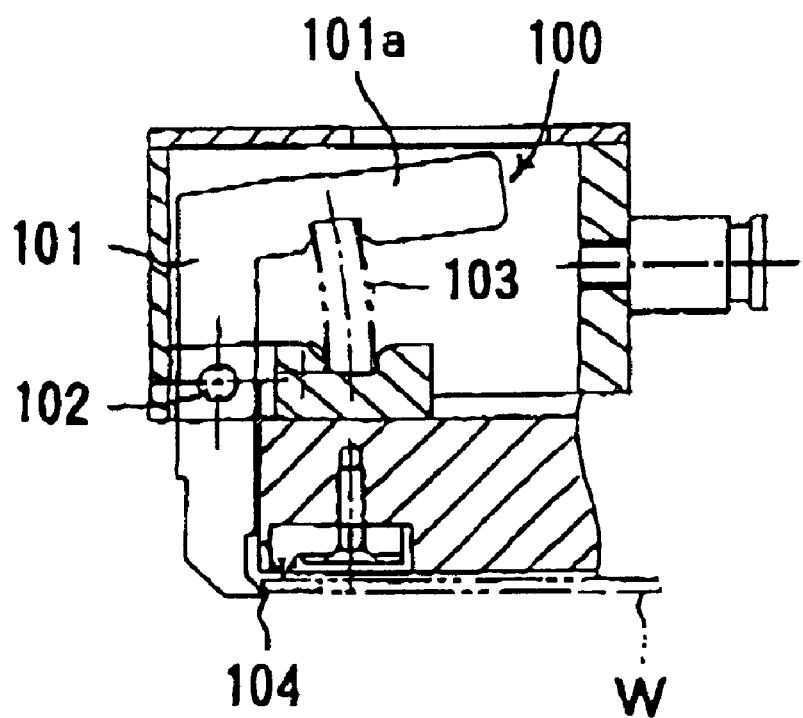

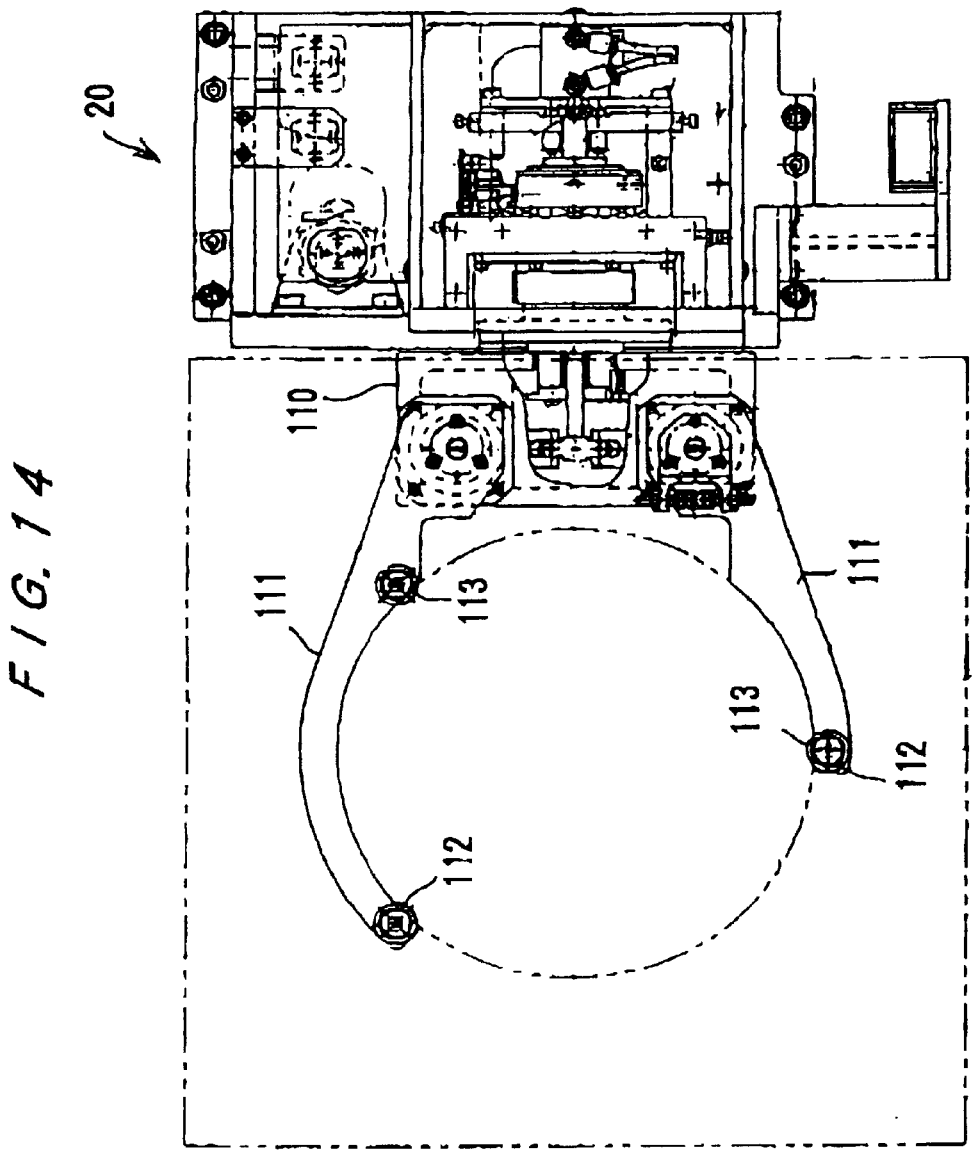

F I G. 1 5
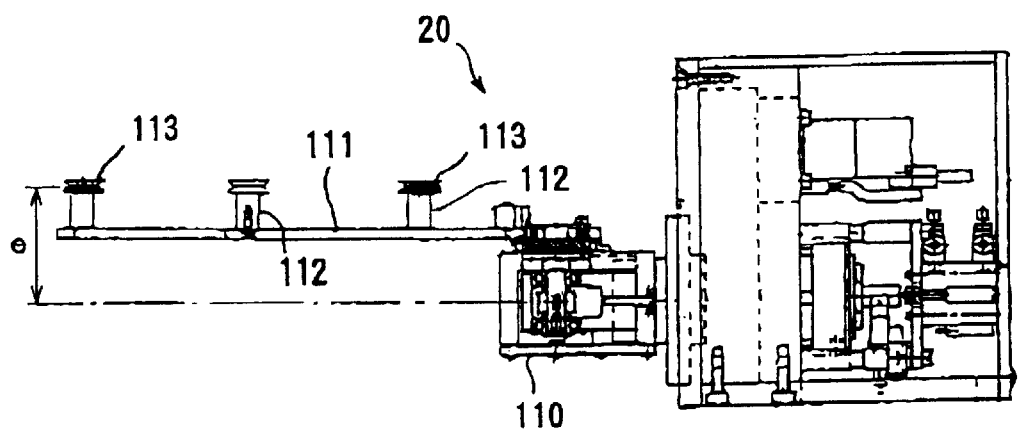

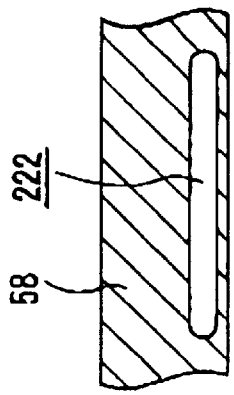
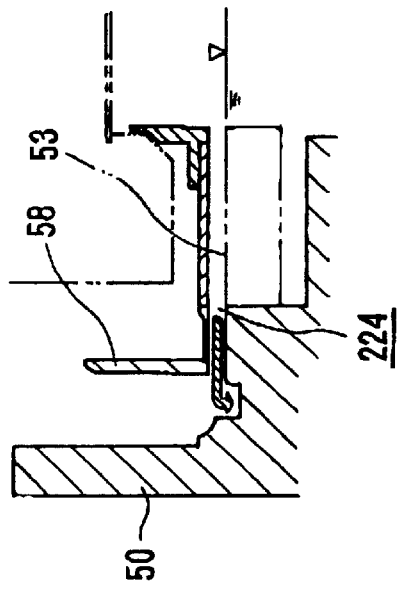
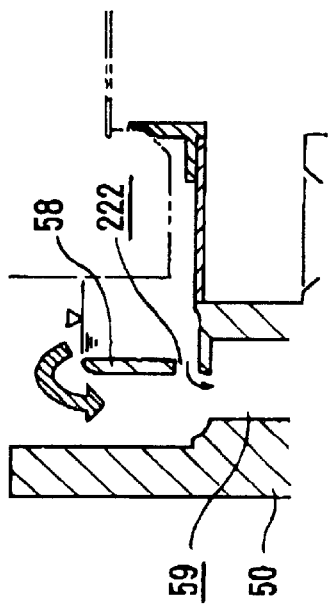
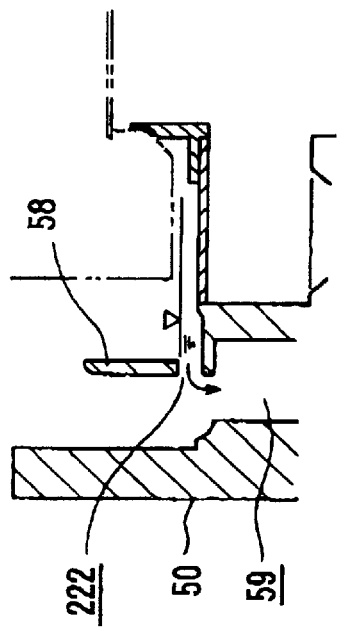

F I G. 28
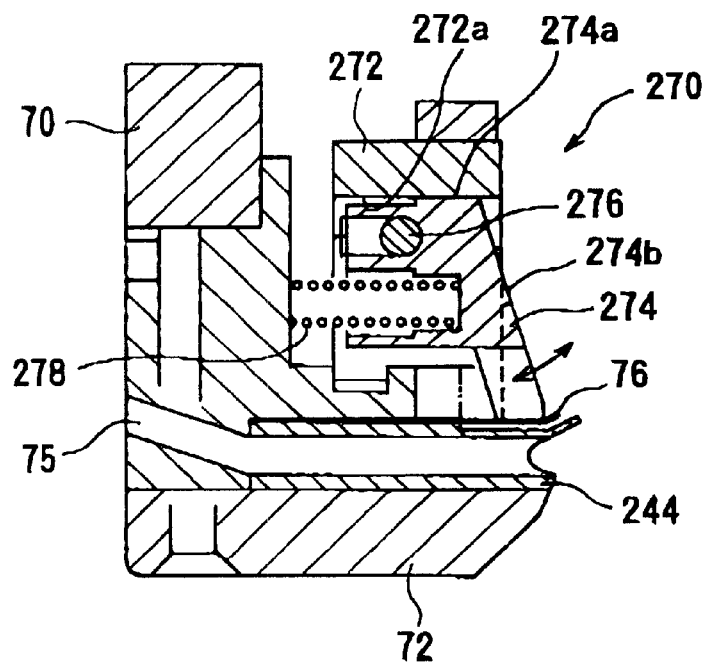
F I G. 29
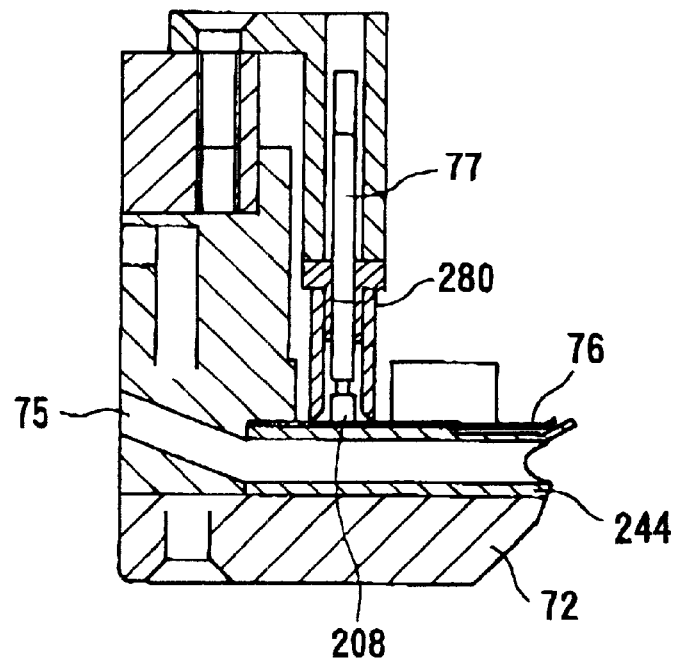

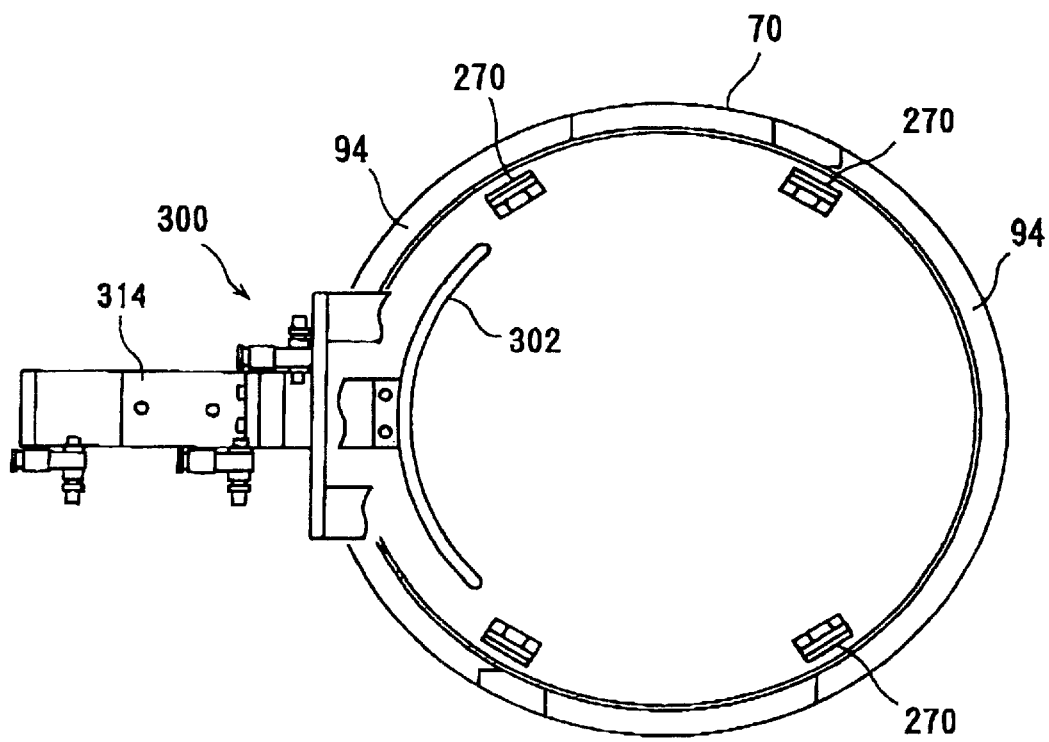
F I G. 30

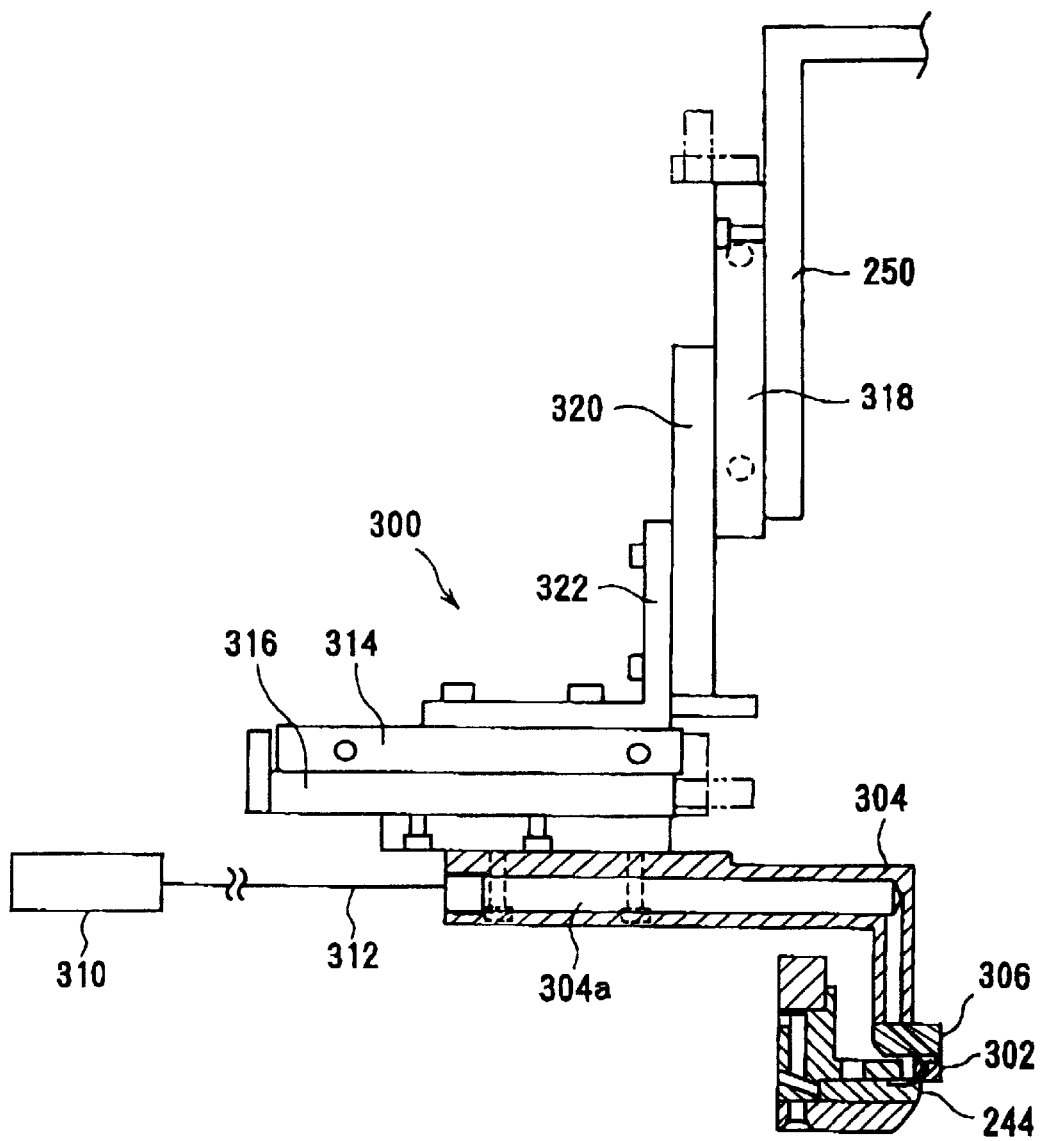
F I G. 31

PLATING APPARATUS AND METHOD

BACKGROUND OF THE INVENTION

1. Field of the Invention

The present invention relates to a plating apparatus and method, and more particularly to a plating apparatus and method for filling interconnection grooves formed in a semiconductor substrate or the like with metal such as copper.

2. Description of the Related Art

Generally, aluminum or aluminum alloy has been surface of a semiconductor substrate. The higher integration of integrated circuits on the semiconductor substrate requires that a material having a higher electric conductivity should be used for interconnection circuits. Therefore, there has been proposed a method comprising plating a surface of a substrate to fill interconnection patterns formed in the substrate with copper or copper alloy.

Various methods such as chemical vapor deposition (CVD) process, sputtering process, and the like have been used to fill interconnection patterns formed in a substrate with copper or copper alloy. However, when a metallic layer on a substrate is formed of copper or copper alloy, i.e., when copper interconnections are formed on the substrate, the CVD process requires high cost, and, if an aspect ratio is high (i.e., the depth of the pattern is larger than the width), then it is difficult to fill the interconnection patterns with copper or copper alloy in the sputtering process. Therefore, the aforementioned plating method is most effective to fill interconnection patterns formed in a substrate with copper or copper alloy.

There are various methods for plating a surface of a semiconductor substrate with copper. For example, in a cup-type plating method, a dip-type plating method, or the like, a plating container always holds a plating solution, and a substrate is dipped into the, plating solution. In another plating method, a plating container holds a plating solution only when a substrate is fed into the plating container. Further, in an electrolytic plating method, an electric potential difference is applied to plate a substrate. On the other hand, in an electroless plating method, an electric potential difference is not applied.

A conventional plating apparatus for plating a substrate with copper in these methods comprises a plating unit for plating a substrate, and, in addition, a plurality of supplementary units such as a cleaning unit for cleaning and drying a plated substrate and a transfer robot horizontally disposed for transferring a substrate between these units. The substrate is transferred between these units. A predetermined process is performed in each of units, and then the substrate is transferred to a next unit.

However, with the conventional plating apparatus, since it is difficult to efficiently dispose units for plating a substrate or performing its supplementary process in one housing unit, the conventional plating apparatus requires a large space to be installed in order to continuously plate the substrate in the housing unit. Further, for example, when the substrate is plated in a housing unit having a clean atmosphere, chemicals used in the plating process are diffused as chemical mist or gas and hence attached to a processed substrate.

SUMMARY OF THE INVENTION

The present invention has been made in view of the above drawbacks. It is therefore an object of the present invention to provide a plating apparatus and method which comprises a plurality of units (pieces of equipments) disposed efficiently in one housing unit for continuously plating a substrate, and can hence reduce a space to be installed, and can prevent the substrate from being contaminated with chemicals used in the plating process.

According to a first aspect of the present invention, there is provided a plating apparatus for continuously plating a surface of a substrate with metal and performing its supplementary process in one housing unit. The plating apparatus comprises a cassette stage for placing a substrate cassette thereon, the substrate cassette accommodating a substrate, a pre-treatment unit for pre-treating a surface of a substrate, and a plating unit for plating a surface of the substrate pre-treated in the pre-treatment unit. A first substrate stage is disposed between the cassette stage and the pre-treatment unit for holding a substrate placed thereon. A cleaning and drying unit is disposed between the cassette stage and the first substrate stage for cleaning a plated substrate with pure water and drying the substrate. A first transfer device transfers a substrate between the substrate cassette, the cleaning and drying unit, and the first substrate stage, and a second transfer device transfers a substrate between the first substrate stage, the pre-treatment unit, and the plating unit.

With this construction, a substrate is pre-treated and plated after being taken out of the substrate cassette, and then cleaned with pure water and dried. Thus, a series of the processes can be performed continuously and efficiently in one housing unit, and hence the plated substrate can successively be transferred to a next unit.

According to a second aspect of the present invention, there is provided a plating apparatus for continuously plating a surface of a substrate with metal and performing its supplementary process in one housing unit. The plating apparatus comprises a cassette stage for placing a substrate cassette thereon, the substrate cassette accommodating a substrate, a pre-treatment unit for pre-treating a surface of a substrate, and a plating unit for plating a surface of the substrate pre-treated in the pre-treatment unit. A first substrate stage is disposed between the cassette stage and the pre-treatment unit for holding a substrate placed thereon, and a chemical liquid cleaning unit disposed between the cassette stage and the first substrate stage for cleaning a plated substrate with chemical liquid. A cleaning and drying unit is disposed between the cassette stage and the chemical liquid cleaning unit for cleaning a plated substrate with pure water and drying the substrate, a second substrate stage is disposed between the chemical liquid cleaning unit and the cleaning and drying unit for holding a substrate placed thereon. A first transfer device transfers a substrate between the substrate cassette, the cleaning and drying unit, and the second substrate stage, a second transfer device transfers a substrate between the first substrate stage, the pre-treatment unit, and the plating unit, and a third transfer device transfers a substrate between the first semiconductor stage, the chemical liquid cleaning unit, and the second substrate stage.

With this construction, a substrate is pre-treated and plated after being taken out of the substrate cassette, and then cleaned with chemical liquid. Thereafter, the substrate is cleaned with pure water and dried. Thus, a series of the processes can be performed continuously and efficiently in one housing unit, and hence the plated substrate can successively be transferred to a next unit.

In a preferred aspect of the present invention, at least one of the first substrate stage and the second substrate stage comprises two substrate stages, and at least one of the two substrate stages in the at least one of the first substrate stage and the second substrate stage is constituted so as to place a substrate thereon and clean the substrate. With this construction, at least one of a plated substrate and a substrate cleaned with chemical liquid can be placed on and cleaned in the substrate stage having a cleaning function, and can then be transferred to a next unit.

In a preferred aspect of the present invention, the housing unit has a partition wall for dividing the housing unit into a plating section and a clean section. The plating section has the pre-treatment unit, the plating unit, the fist substrate stage, and the second transfer device therein. The clean section has another unit therein. The partition wall has a shutter for passing a substrate therethrough; air can individually be supplied into and exhausted from each of the plating section and the clean section, and the pressure of the clean section is controlled so as to be higher than the pressure of the plating section.

In the plating section, chemicals used in the pre-treatment and plating processes are diffused as chemical mist or gas. With the above construction, the plating section is separated from the clean section required to be clean, and measures against particles are taken in each of the sections. When the pressure of the clean section is controlled so as to be higher than the pressure of the plating section, the chemical mist or gas can be prevented from being attached to a processed substrate.

In a preferred aspect of the present invention, a container for accommodating a substrate for trial operation is disposed in the housing unit, and one of the transfer devices takes out the substrate for trial operation from the container and returns the substrate for trial operation to the container. This construction can eliminate contamination or lowering of the throughput caused by introduction of the substrate for trial operation from the outside when trial operation is conducted.

In a preferred aspect of the present invention, the container for accommodating a substrate for trial operation is disposed in the vicinity of the first substrate stage. The second transfer device takes out the substrate for trial operation from the container and returns the substrate for trial operation to the container. With this construction, trial operation using a substrate for trial operation can be conducted in such a manner that the substrate for trial operation is pre-treated, plated, cleaned and dried, and then returned to the container.

A plurality of plating units may be provided in the housing, and a plating solution may respectively be fed to each of the plating units from a plating solution regulating tank in a single plating process system. In this case, when a plating solution regulating tank having a large capacity is used in the process plating system, and the flow rate in each of the plating units is controlled, a variation in quality of the plating solution respectively fed to each of the plating units can be suppressed.

According to a third aspect of the present invention, there is provided a processing apparatus for processing a semiconductor substrate with chemical liquid or pure water, the processing apparatus comprising an inverting mechanism for inverting a semiconductor substrate.

According to a fourth aspect of the present invention, there is provided a plating apparatus for plating a surface of a semiconductor substrate. The plating apparatus comprises a pre-treatment unit for pre-treating a semiconductor substrate to be plated with chemical liquid or pure water, the pre-treatment unit having an inverting mechanism for inverting the semiconductor substrate, and a plating unit for plating a surface of the semiconductor substrate pre-treated in the pre-treatment unit. With this construction, the surface of the substrate is pre-treated with chemical liquid in such a state that the front surface of the substrate faces upwardly. Thereafter, the substrate is inverted so that the front surface of the substrate faces downwardly, and then transferred to the plating unit, in which the substrate can be plated by a face-down-type plating.

According to a fifth aspect of the present invention, there is provided a plating method for continuously plating a surface of a substrate with metal and performing its supplementary process in one housing unit. The plating method comprises placing a substrate cassette accommodating a substrate on a cassette stage, transferring the substrate in the substrate cassette to a first substrate stage by a first transfer device, transferring the substrate on the first substrate stage to a pre-treatment unit from the first substrate stage by a second transfer device, transferring the substrate pre-treated in the pre-treatment unit to a plating unit by the second transfer device, and transferring the substrate plated in the plating unit to a cleaning and drying unit.

According to a sixth aspect of the present invention, there is provided a plating method for continuously plating a surface of a substrate with metal and performing its supplementary process in one housing unit. The plating method comprises placing a substrate cassette accommodating a substrate on a cassette stage, transferring a substrate in the substrate cassette to a first substrate stage by a first transfer device, transferring the substrate on the first substrate stage to a pre-treatment unit from the first substrate stage by a second transfer device, transferring the substrate pre-treated in the pre-treatment unit to a plating unit by the second transfer device, transferring the substrate plated in the plating unit to the first substrate stage by the second transfer device, transferring the substrate on the first substrate stage to a chemical liquid cleaning unit from the first substrate stage by a third transfer device, transferring the substrate cleaned with chemical liquid in the chemical liquid cleaning unit to the second substrate stage, and transferring the substrate on the second substrate stage to a cleaning and drying unit from the second substrate stage.

According to a seventh aspect of the present invention, there is provided a plating unit having a plating process container, the plating process container comprises a plating container having a plating chamber therein for holding a plating solution in the plating chamber, the plating chamber having an anode at its bottom. A plurality of plating solution supply nozzles eject the plating solution toward the central portion of the plating chamber. A regulating ring is provided in the vicinity of the peripheral portion of the plating chamber. A first plating solution discharge port discharges the plating solution in the plating chamber from the bottom of the plating chamber, and a second plating solution discharge port discharges the plating solution overflowing the peripheral portion of the plating chamber.

With this construction, the plating solution ejected from the plating solution supply nozzles into the central portion of the plating chamber collides at the central portion of the plating chamber to form an upward flow and a downward flow. The upward flow pushes up the liquid surface of the plating solution, and the downward flow pushes away peeled pieces of a black film formed on the surface of the anode. Thus, air bubbles can be prevented from remaining between the substrate and the liquid surface of the plating solution, and the black film can simultaneously be prevented from being attached to the surface of the substrate.

In a preferred aspect of the present invention, the anode is held by an anode support detachably mounted on the plating container. In this case, the anode can easily be attached to and detached from the plating container via the anode support to thus facilitate maintenance and replacement of the anode, and the like.

A labyrinth seal comprising a plurality of grooves arranged in parallel may be provided on at least one of the anode support and the plating container around the inlet of the anode support. Such a labyrinth seal can ensure reliable sealing of a gap between the plating container and the anode support to thus prevent the plating solution from leaking out.

An inert gas introduction passage for introducing inert gas and a plating solution return passage for discharging the plating solution remaining within the grooves may be connected to at least one of the grooves. When the plating solution remains within the grooves constituting the labyrinth seal, an inert gas is introduced to the grooves through the inert gas introduction passage, and hence the plating solution remaining within the grooves can be discharged to the exterior through the plating solution return passage.

According to an eighth aspect of the present invention, there is provided a plating unit comprising a rotatable housing having a substrate holding member provided at the lower end thereof, the substrate holding member projecting radially inwardly and abutting a peripheral portion of a substrate to hold the substrate. A pressing member is disposed in the housing for pressing the peripheral portion of the substrate against the substrate holding member to hold the substrate, the pressing member being rotatable together with the housing.

With this construction, a substrate can be transferred to the pressing member from a robot arm or the like in such a state that the pressing member is raised, and then the pressing member can be lowered. The peripheral portion of the substrate is held between the pressing member and the substrate holding member of the housing, and hence the substrate can be raised to be rotated in this state.

In a preferred aspect of the present invention, a plurality of air vent holes are formed in the substrate holding member provided at the lower end of the housing. In this case, air bubbles between the substrate and the liquid surface of the plating solution can easily be discharge through the air vent holes to the exterior.

In a preferred aspect of the present invention, the pressing member comprises a chuck mechanism disposed at the peripheral portion thereof for detachably holding the substrate on the lower surface of the pressing member.

In a preferred aspect of the present invention, a contact for a cathode electrode is disposed on the substrate holding member of the housing, and a feeding contact is disposed at the outer circumferential side of the pressing member. The contact for the cathode electrode is energized when a substrate is held by the substrate holding member and the pressing member. The feeding contact energizes the contact for the cathode electrode when the pressing member is lowered to bring the contact for the cathode electrode into contact with the feeding contact. In this case, since the plating solution is reliably sealed by the substrate holding member, the plating solution can be prevented from being brought into contact with the contact for the cathode electrode and the feeding contact.

According to a ninth aspect of the present invention, there is provided a plating unit comprising, a head having a rotatable housing, a vertically movable pressing member housed in the housing, and a substrate holding member disposed in the housing for holding a peripheral portion of a substrate between the pressing member ring and the substrate holding member. A plating process container is disposed below the head for holding a plating solution so that the liquid surface of the plating solution has a liquid level for plating which is higher than a position of a substrate held by the housing, and a liquid level for transferring the substrate which is lower than a position of a substrate held by the housing.

According to a tenth aspect of the present invention, there is provided a plating unit comprising, a head having a rotatable housing, a vertically movable pressing ring housed in the housing, and a substrate holding member disposed in the housing for holding a peripheral portion of a substrate between the pressing ring and the substrate holding member. A plating process container is disposed below the head for holding a plating solution so that the liquid surface of the plating solution has a liquid level for plating which is higher than a position of a substrate held by the housing, and a liquid level for transferring the substrate which is lower than a position of a substrate held by the housing.

According to an eleventh aspect of the present invention, there is provided a plating unit comprising, a head having a rotatable housing, a clamp mechanism with a swing link housed in the housing, the swing link being swingable in the horizontal direction, and a substrate holding member disposed in the housing for holding a peripheral portion of a substrate between the swing link and the substrate holding member. A plating process container is disposed below the head for holding a plating solution so that the liquid surface of the plating solution has a liquid level for plating which is higher than a position of a substrate held by the housing, and a liquid level for transferring the substrate which is lower than a position of a substrate held by the housing.

According to a twelfth aspect of the present invention, there is provided a plating unit comprising a head having a rotatable housing, the housing having an elastic member therein elastically deformable by pneumatic pressure, and a substrate holding member disposed in the housing for holding a peripheral portion of a substrate between the elastic member and the substrate holding member; and a plating process container is disposed below the head for holding a plating solution so that the liquid surface of the plating solution has a liquid level for plating which is higher than a position of a substrate held by the housing, and a liquid level for transferring the substrate which is lower than a position of a substrate held by the housing.

According to a thirteenth aspect of the present invention, there is provided a plating unit comprising, a head having a rotatable housing, the housing having a substrate holding member for holding a substrate, and a plating process container disposed below the head for holding a plating solution so that the liquid surface of the plating solution has at least two levels.

With this construction, the mechanism of the head can be simplified and compact. In addition, the plating process is carried out when the plating solution within the plating process container is at a liquid level for plating, while the substrate is dewatered and transferred when the plating solution is at a liquid level for transferring the substrate.

A contact for a cathode which is energized to the substrate when the substrate is held by the substrate holding member may be provided on the upper surface of the substrate holding member of the housing.

A substrate centering mechanism for performing centering of a substrate may be provided on the inner circumferential surface of the housing above the substrate holding member. A substrate is held by a transfer robot or the like, is carried into the housing, and is placed on the substrate holding member. In this case, when holding of the substrate by the transfer robot or the like is released, the centering of the substrate can be carried out.

The substrate centering mechanism may comprise a positioning block having a tapered inner surface which is widened outwardly in the upward direction, an elastic member for inwardly urging the positioning block, and a stopper for restricting an inward movement of the positioning block. While a substrate is guided by the tapered surface, the substrate is urged inwardly by the elastic member, thereby carrying out the centering of the substrate. With this construction, a substrate is held by a transfer robot or the like, is carried into the housing, and is placed on the substrate holding member. In this case, when the center of the substrate deviates from the center of the substrate holding member, the positioning block is rotated outwardly against the urging force of the elastic member and, upon the release of holding of the substrate by the transfer robot or the like, the positioning block is returned to the original position by the urging force of the elastic member. Thus, the centering of the substrate can be carried out.

According to a fourteenth aspect of the present invention, there is provided a plating unit comprising, a head having a substrate holding member for holding a substrate, a plating process container disposed below the head for holding a plating solution, and a plating solution suction mechanism for removing plating solution remaining at a portion abutting the peripheral portion of a substrate at the inner circumferential end of the substrate holding member.

The plating solution is likely to be left at a portion abutting the peripheral portion of a substrate at the inner circumferential end of the substrate holding member. With this construction, the plating solution remaining at the abutting portion is forced to be removed, thereby preventing the plating solution from being dried and becoming a source for particles.

A plating solution suction nozzle constituting the plating solution suction mechanism may extend in an arc form along the inner circumferential surface of the substrate holding member and be vertically and horizontally movable. With this construction, the plating solution left in the tip end of the annular projecting portion of the substrate holding member can be sucked and removed in a short time with high efficiency.

According to a fifteenth aspect of the present invention, there is provided a plating apparatus for continuously plating a surface of a substrate with metal and performing its supplementary process in one housing unit. The plating apparatus comprises a cassette stage for placing a substrate cassette thereon, the substrate cassette accommodating a substrate, a pre-plating unit for pre-plating a surface of a substrate, and a plating unit for plating a surface of the substrate pre-plated in the pre-plating unit. A first substrate stage is disposed between the cassette stage and the pre-plating unit for holding a substrate placed thereon. A cleaning and drying unit is disposed between the cassette stage and the first substrate stage for cleaning a plated substrate with pure water and then drying the substrate. A first transfer device transfers a substrate between the substrate cassette, the cleaning and drying unit, and the first substrate stage, and a second transfer device transfers a substrate between the first substrate stage, the pre-plating unit, and the plating unit.

With this construction, a substrate is pre-plated and plated after being taken out of the substrate cassette, and then cleaned with pure water and dried. Thus, a series of the processes can be performed continuously and efficiently in one housing unit, and hence the plated substrate can successively be transferred to a next unit.

According to a sixteenth aspect of the present invention, there is provided a plating apparatus for continuously plating a surface of a substrate with metal and performing its supplementary process in one housing unit. The plating apparatus comprises a cassette stage for placing a substrate cassette thereon, the substrate cassette accommodating a substrate, a pre-plating unit for pre-plating a surface of a substrate, and a plating unit for plating a surface of the substrate pre-plated in the pre-plating unit. A first substrate stage is disposed between the cassette stage and the pre-plating unit for holding a substrate placed thereon. A chemical liquid cleaning unit is disposed between the cassette stage and the first substrate stage for cleaning a plated substrate with chemical liquid. A cleaning and drying unit is disposed between the cassette stage and the chemical liquid cleaning unit for cleaning a plated substrate with pure water and then drying the substrate. A second substrate stage is disposed between the chemical liquid cleaning unit and the cleaning and drying unit for holding a substrate placed thereon. A first transfer device transfers a substrate between the substrate cassette, the cleaning and drying unit, and the second substrate stage, a second transfer device transfers a substrate between the first substrate stage, the pre-plating unit, and the plating unit, and a third transfer device transfers a substrate between the first semiconductor stage, the chemical liquid cleaning unit, and the second substrate stage.

With this construction, a substrate is pre-plated and plated after being taken out of the substrate cassette, and then cleaned with chemical liquid. Thereafter, the substrate is cleaned with pure water and dried. Thus, a series of the processes can be performed continuously and efficiently in one housing unit, and hence the plated substrate can successively be transferred to a next unit.

According to a seventeenth aspect of the present invention, there is provided a plating apparatus for continuously plating a surface of a substrate with metal and performing its supplementary process in one housing unit. The plating apparatus comprises a cassette stage for placing a substrate cassette thereon, the substrate cassette accommodating a substrate, a pre-treatment unit for pre-treating a surface of a substrate, and a plating unit for plating a surface of the substrate pre-treated in the pre-treatment unit. A first substrate stage holds a substrate placed thereon. A cleaning and drying unit cleans a plated substrate with pure water and dries the substrate. A first transfer device transfers a substrate, and a second transfer device transfers a substrate. The housing unit has a partition wall for dividing the housing unit into a plating section and a clean section. The plating section has at least the pre-treatment unit, the plating unit, the fist substrate stage, and the second transfer device therein. The clean section has another unit therein, and the pressure of the clean section is controlled so as to be higher than the pressure of the plating section.

In a preferred aspect of the present invention, the first substrate stage comprises two substrate stages, and at least one of the two substrate stages in the first substrate stage is constituted so as to place a substrate thereon and clean a substrate.

In a preferred aspect of the present invention, a container for accommodating a substrate for trial operation is disposed in the housing unit, and one of the transfer devices takes out the substrate for trial operation from the container and returns the substrate for trial operation to the container.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 5 is an enlarged view showing a part of the plating unit shown in FIG. 4;

FIG. 13 is an enlarged cross-sectional view showing a part of the chuck mechanism shown in FIG. 12;

FIG. 14 is a plan view showing an inverter in the plating apparatus;

FIG. 15 is a front view showing the inverter shown in FIG. 14;

FIG. 27 is a schematic view explanatory of the flow of a plating solution at the time of a plating process and at the time of a non-plating process;

FIG. 28 is an enlarged cross-sectional view showing a centering mechanism in the plating unit;

FIG. 29 is a cross-sectional view showing a feeding contact (probe) in the plating unit;

FIG. 30 is a plan view showing a plating solution suction mechanism in the plating unit; and FIG. 31 is a front view showing the plating solution suction mechanism.

DETAILED DESCRIPTION OF THE PREFERRED EMBODIMENTS

A plating apparatus according to embodiments of the present invention will be described below with reference to the accompanying drawings.

A plating apparatus according to embodiments of the present invention is used for plating a surface of a semiconductor substrate with copper, for thereby manufacturing semiconductor devices on which interconnections having a copper layer are formed. This plating process will be described below with reference to FIGS. 1A through 1C.

Figure 1A:
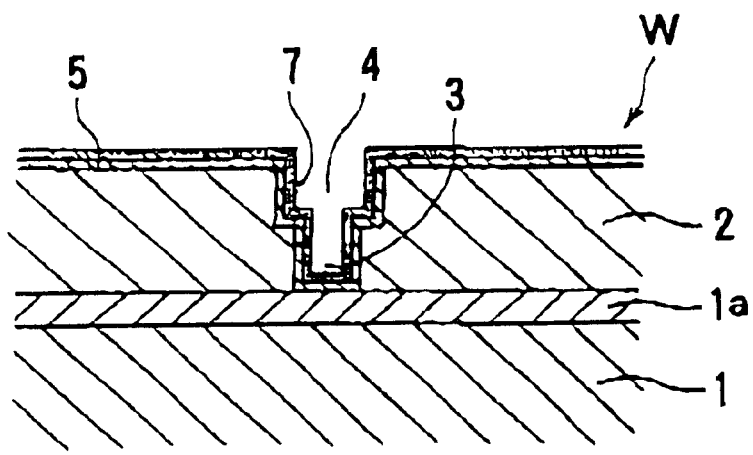
FIGS. 1A through 1C are cross-sectional views showing an example of a plating process utilizing the plating apparatus according to the present invention.

As shown in FIG. 1A, an insulating film 2 of $SiO_2$ is deposited over an electrically conductive layer 1a on a semiconductor base 1 having semiconductor elements, and then a contact hole 3 and an interconnection groove 4 are formed by a lithography etching technology. A barrier layer 5 made of TiN or the like is formed on the insulating film 2, and a copper seed layer 7 used as a feeding layer in an electrolytic plating is formed on the barrier layer 5 by sputtering or the like.

Figure 1B:
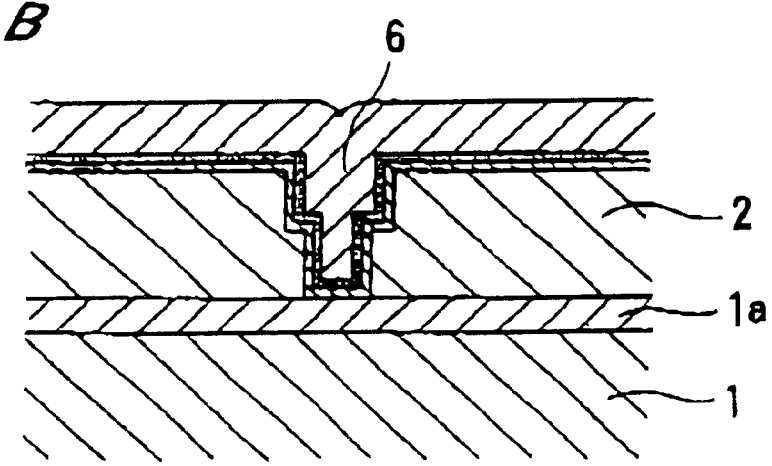
Figure 1C:
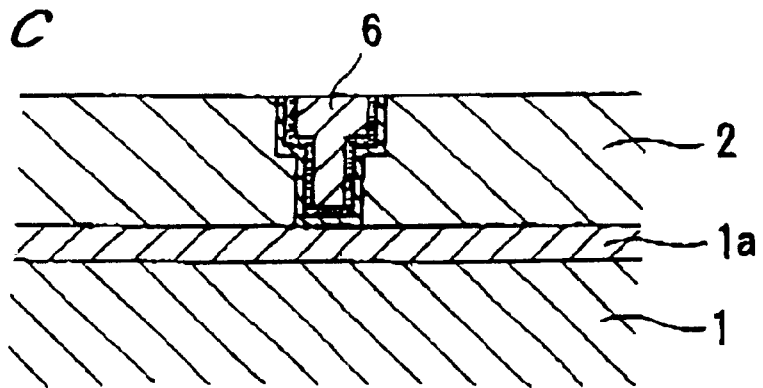

Subsequently, as shown in FIG. 1B, a surface of a substrate W is plated with copper. Hence, the contact hole 3 and the interconnection groove 4 on the semiconductor base 1 are filled with copper, and a copper layer 6 is formed on the insulating film 2. Thereafter, the copper layer 6 on the insulating film 2 is removed by chemical mechanical polishing (CMP) so that the surface of the copper layer 6 filled in the contact hole 3 and the interconnection groove 4 is made substantially even with the surface of the insulating film 2. Thus, as shown in FIG. 1C, an interconnection comprising the copper layer 6 is formed.

Figure 2:
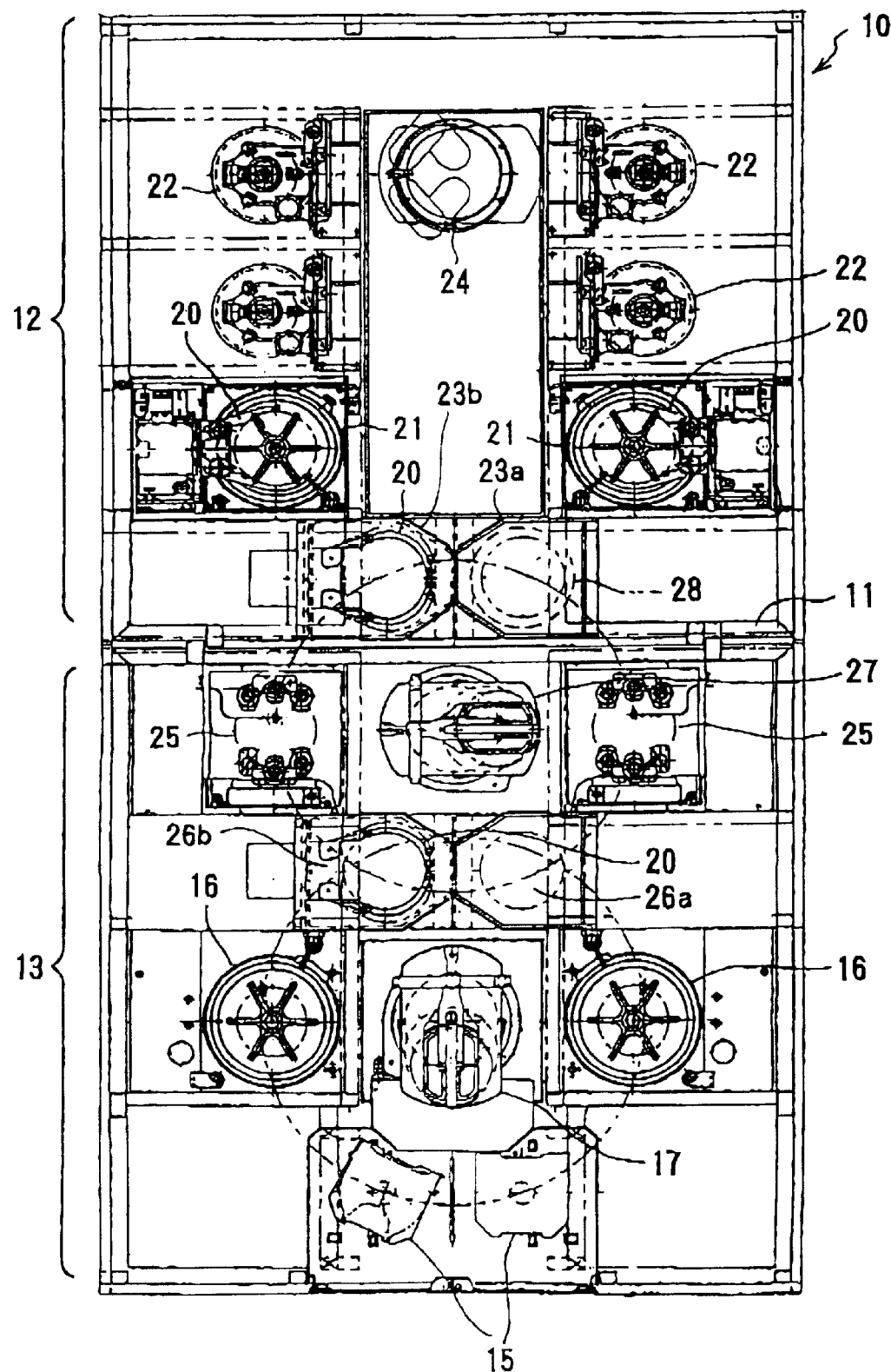
FIG. 2 is a plan view showing a layout of a plating apparatus according to a first embodiment of the present invention.

A plating apparatus for electrolytically plating a semiconductor substrate W according to a first embodiment of the present invention will be described below with reference to FIG. 2. As shown in FIG. 2, the plating apparatus is disposed in a rectangular housing unit 10, and is constituted so as to plate a semiconductor substrate with copper continuously. The housing unit 10 has a partition wall 11 for dividing the housing unit 10 into a plating section 12 and a clean section 13. Air can individually be supplied into and exhausted from each of the plating section 12 and the clean section 13. The partition wall 11 has a shutter (not shown) capable of opening and closing. The pressure of the clean section 13 is lower than the atmospheric pressure and higher than the pressure of the plating section 12. This can prevent the air in the clean section 13 from flowing out of the housing unit 10 and can prevent the air in the plating section 12 from flowing into the clean section 13.

In the clean section 13, there are provided two cassette stages 15 for placing a substrate cassette thereon, and two cleaning and drying units 16 for cleaning (rinsing) a plated substrate with pure water and drying. Further, a rotatable fixed-type first transfer device (tetraxial robot) 17 for transferring a substrate is provided in the clean section 13. For example, the cleaning and drying unit 16 has cleaning liquid supply nozzles for supplying ultrapure water to both surfaces of a substrate, and spins the substrate at a high speed to dewater and dry the substrate.

On the other hand, in the plating section 12, there are provided two pre-treatment units 21 for pre-treating a surface of a substrate for plating, and inverting the pre-treated substrate with an inverter 20 (see FIGS. 14 and 15), four plating units 22 for plating a surface of a substrate with copper in such a state that the front surface of the substrate faces downwardly, and two first substrate stages 23a, 23b for holding a substrate placed thereon. Further, a rotatable mobile-type second transfer device (tetraxial robot) 24 for transferring a substrate is provided in the plating section 12.

In the clean section 13, there are provided two chemical liquid cleaning units 25 for cleaning a plated substrate with chemical liquid, and second substrate stages 26a, 26b disposed between the chemical liquid cleaning units 25 and the cleaning and drying units 16. A rotatable fixed-type third transfer device (tetraxial robot) 27 for transferring a substrate is provided between the two chemical liquid cleaning units 25.

One of the first substrate stages and one of the second substrate stages, i.e., the first substrate stage 23b and the second substrate stage 26b, are constituted so as to clean the substrate with water. Each of the first substrate stage 23b and the second substrate stage 26b has an inverter 20 for inverting a substrate (see FIGS. 14 and 15).

Thus, the first transfer device 17 transfers a substrate between the substrate cassettes placed on the cassette stages 15, the cleaning and drying units 16, and the second substrate stages 26a, 26b. The second transfer device 24 transfers a substrate between the first substrate stages 23a, 23b, the pre-treatment units 21, and the plating units 22. The third transfer device 27 transfers a substrate between the first substrate stages 23a, 23b, the chemical liquid cleaning units 25, and the second substrate stages 26a, 26b.

A container 28 for accommodating substrates for trial operation is disposed in the housing unit 10, and located below the first substrate stage 23a. The second transfer device 24 takes out a substrate for trial operation from the container 28, and returns it to the container 28 after trial operation. Thus, the container 28 provided in the housing unit 10 for accommodating the substrates for trial operation can eliminate contamination or lowering of the throughput caused by introduction of substrates for trial operation from the outside when trial operation is conducted.

As long as the substrates for trial operation can be taken out from the container 28 and returned to the container 28 by any of the transfer devices, the container 28 may be placed anywhere in the housing unit 10. However, when the container 28 is disposed in the vicinity of the first substrate stage 23a, the trial operation can be conducted in such a manner that a substrate for trial operation is pre-treated, plated, cleaned and dried, and then returned to the container 28.

The transfer device 17 has two recess-type hands, respectively for supporting a peripheral edge of a substrate by a recess. The upper hand is used for handling a dry substrate and the lower hand is used for handling a wet substrate. Each of the transfer devices 24 and 27 has two recess-type hands, which are used for handling a wet substrate. The hands of the transfer devices are not limited to those types described above.

In the present embodiment, the plating apparatus comprises the chemical liquid cleaning units 25 for cleaning a surface of a substrate with chemical liquid such as dilute hydrofluoric acid or hydrogen peroxide. If it is not necessary to clean a plated substrate with chemical liquid, the chemical liquid cleaning units 25 are not required. In this case, the first transfer device 17 transfers a substrate between the substrate cassettes placed on the cassette stages 15, the cleaning and drying units 16, and the first substrate stages 23a, 23b to thus dispense with the third transfer device 27 and the second substrate stages 26a, 26b.

Next, the processing flow of the substrate in the plating apparatus according to the present embodiment will be described below.

The substrates are accommodated by the substrate cassette in such a state that the front surface of the substrate (surface on which semiconductor elements are formed, i.e., surface to be processed) faces upwardly, and the substrate cassette accommodating such substrates is placed on the cassette stage 15. The first transfer device 17 takes out a substrate from the substrate cassette, moves to the second substrate stage 26a, and places the substrate on the second substrate stage 26a. Then, the third transfer device 27 transfers the substrate from the second substrate stage 26a to the first substrate stage 23a. Thereafter, the second transfer device 24 receives the substrate from the first substrate stage 23a and transfers the substrate to the pre-treatment unit 21. After the pre-treatment of the substrate is completed in the pre-treatment unit 21, the substrate is inverted by the inverter 20 so that the front surface of the substrate faces downwardly, and then transferred to the second transfer device 24. The second transfer device 24 transfers the substrate to a head of the plating unit 22.

After the substrate is plated and liquid on the substrate is removed in the plating unit 22, the substrate is received by the second transfer device 24, which transfers the substrate to the first substrate stage 23b. The substrate is inverted by the inverter 20 provided at the first substrate stage 23b so that the front surface faces upwardly, and then transferred to the chemical liquid cleaning unit 25 by the third transfer device 27. In the chemical liquid cleaning unit 25, the substrate is cleaned with chemical liquid and rinsed with pure water, and then the liquid on the substrate is removed by spinning. Thereafter, the substrate is transferred to the second substrate stage 26b by the third transfer device 27. Next, the first transfer device 17 receives the substrate from the second substrate stage 26b, and transfers the substrate to the cleaning and drying unit 16. In the cleaning and drying unit 16, the substrate is rinsed with pure water such as deionized water and then spin-dried. The dried substrate is returned to the substrate cassette placed on the cassette stage 15 by the first transfer device 17.

Figure 3:
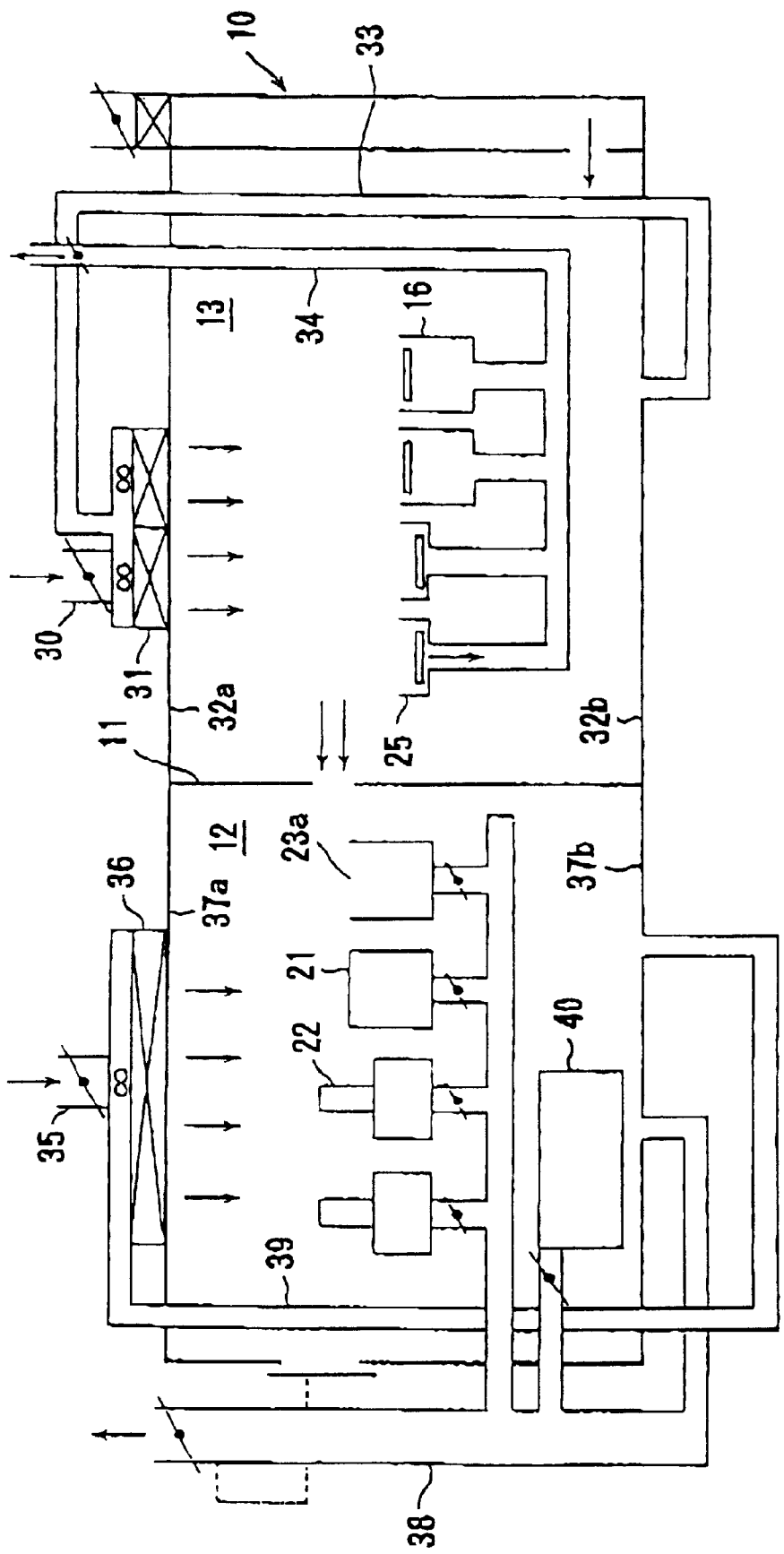
FIG. 3 is an explanatory view showing an air current in the plating apparatus shown in FIG. 2.

FIG. 3 is a schematic view showing an air current in the housing unit 10. In the clean section 13, a fresh external air is introduced through a pipe 30 and pushed into the clean section 13 through a high-performance filter 31 by a fan. Hence, a downflow clean air is supplied from a ceiling 32a to positions around the cleaning and drying units 16 and the chemical liquid cleaning units 25. A large part of the supplied clean air is returned from a floor 32b through a circulation pipe 33 to the ceiling 32a, and pushed again into the clean section 13 through the high-performance filter 31 by the fan, to thus circulate in the clean section 13. A part of the air is discharged from the cleaning and drying units 16 and the chemical liquid units 25 through a pipe 34 to the exterior, so that the pressure of the clean section 13 is set to be lower than the atmospheric pressure.

The plating section 12 having the pre-treatment units 21 and the plating units 22 therein is not a clean section (but a contamination zone). However, it is not acceptable to attach particles to the surface of the substrate. Therefore, in the plating section 12, fresh external air is introduced through a pipe 35, and downflow clean air is pushed into the plating section 12 through a high-performance filter 36 by a fan, for thereby preventing particles from being attached to the surface of the substrate. However, if the whole flow rate of the downflow clean air is supplied by only an external air supply and exhaust, then an enormous air supply and exhaust are required. Therefore, the air is discharged through a pipe 38 to the exterior, and a large part of the downflow is supplied by a circulating air through a circulation pipe 39 extended from a floor 37b, and in a state such that the pressure of the plating section 12 is maintained lower than the pressure of the clean section 13.

Thus, the air returned to a ceiling 37a through the circulation pipe 39 is pushed again into the plating section 12 through the high-performance filter 36 by the fan. Hence, clean air is supplied into the plating section 12 to thus circulate in the plating section 12. In this case, air containing chemical mist or gas emitted from the pre-treatment units 21, the plating units 22, the second transfer device 24, and a plating solution regulating tank 40 is discharged through the pipe 38 to the exterior. Thus, the pressure of the plating section 12 is controlled so as to be lower than the pressure of the clean section 13.

Figure 4:
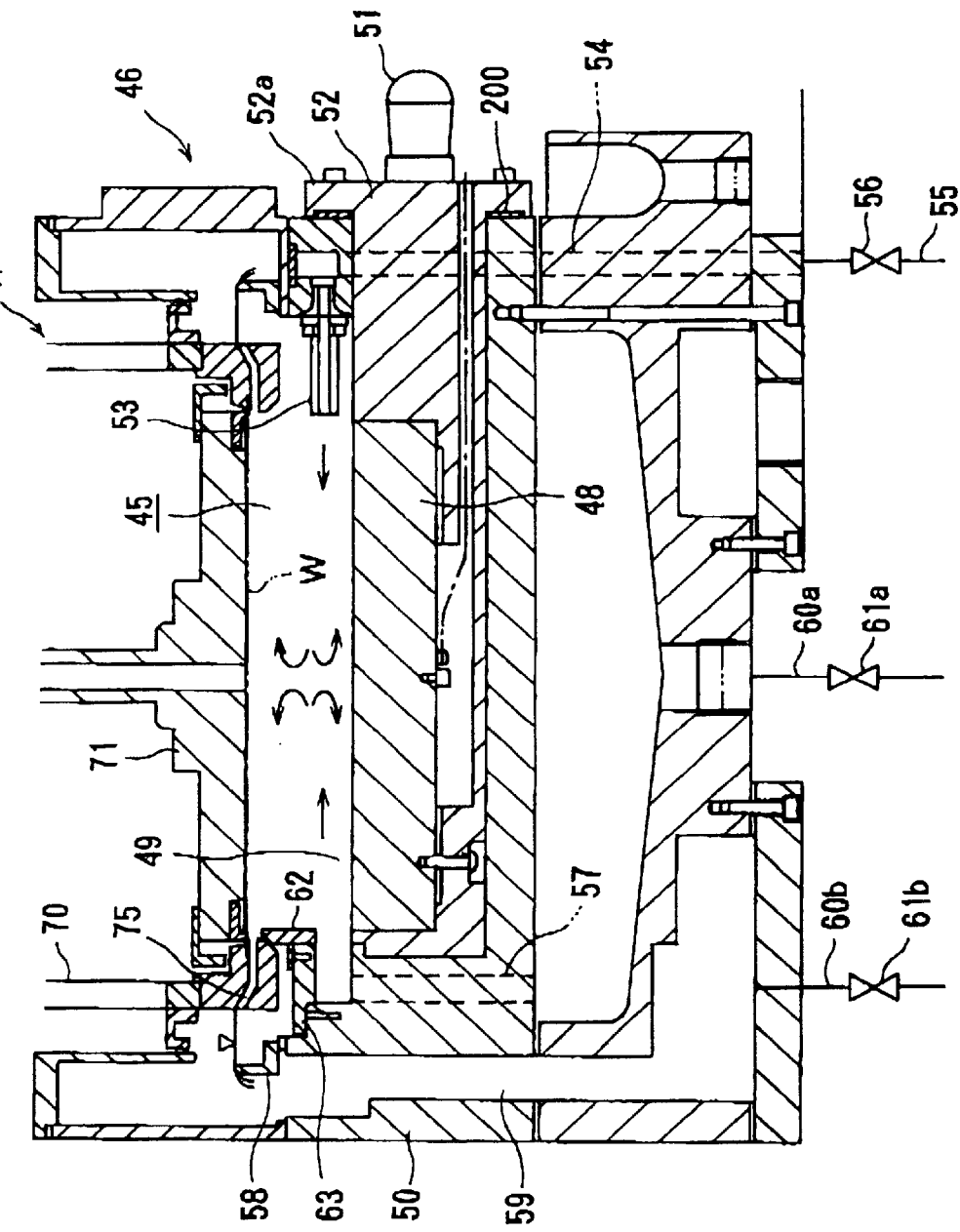
FIG. 4 is an enlarged cross-sectional view showing a main part of a plating unit in the plating apparatus according to the first embodiment of the present invention.

FIG. 4 shows a main part of the plating unit 22. The plating unit 22 mainly comprises a plating process container 46 in substantially cylindrical form for holding a plating solution therein, and a head 47 disposed above the plating process container 46 for holding a substrate. In FIG. 4, the head 47 is located in a plating position in which a substrate W held by the head 47 is lowered.

The plating process container 46 comprises a plating chamber 49, which is upwardly opened, and a plating container 50 for holding a plating solution in the plating chamber 49. An anode 48 made of residual-phosphorus copper, for example, is provided at the bottom of the plating chamber 49. The anode is held by an anode support 52, which is detachably mounted on the plating container 50, i.e., which is drawably mounted via a knob 51 provided on the anode support 52. The anode 48 is connected to an anode of a power supply for plating provided in an external control unit. A sealing member 200 for preventing the plating solution from leaking is interposed between the front surface of the plating container 50 and the backside surface of a flange 52a in the anode support 52. Thus, the anode 48 is held by the anode support 52 detachably mounted on the plating container 50, causing the anode 48 to be easily attached to and detached from the plating container 50 via the anode support 52. Accordingly, this construction facilitates maintenance and replacement of the anode 48, and the like.

The anode 48 is made of copper containing 0.03% to 0.05% phosphorus (residual-phosphorus copper), and hence a black film is formed on the upper surface of the anode 48 as plating proceeds. Such a black film can reduce generation of anode slime.

Figure 6:
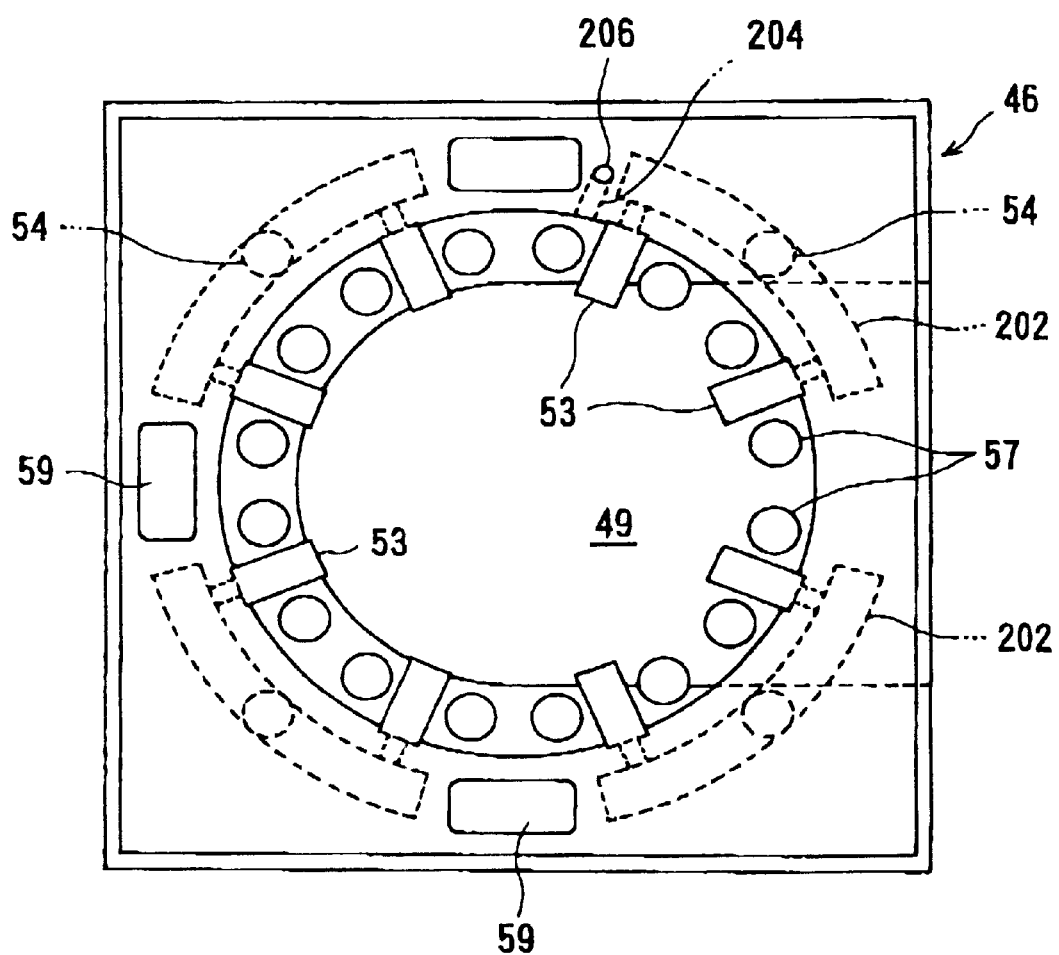
FIG. 6 is a plan view showing a plating process container.

Plating solution supply nozzles 53 horizontally projecting toward the center of the plating chamber 49 are provided on the inner circumferential wall of the plating container 50 at equal intervals along the circumferential direction. Each of the plating solution supply nozzles 53 is communicated with a plating solution supply passage 54 extended vertically through the interior of the plating container 50. In the present embodiment, as shown in FIG. 6, four circumferentially divided plating solution reservoirs 202 in an arc-shaped form are provided in the inner circumferential wall of the plating container 50. Each of the plating solution reservoirs 202 is communicated with the plating solution supply passage 54 located at the central portion along the circumferential direction of the plating solution reservoir 202. Each of the plating solution reservoirs 202 comprises two plating solution supply nozzles 53 provided on both ends of the plating solution reservoir 202. The plating solution of the same flow rate is respectively supplied to each of the plating solution reservoirs 202 via control valves 56 described later. Therefore, the plating solution is homogeneously ejected from each of the plating solution supply nozzles 53 into the plating chamber 49.

Each of the plating solution supply passages 54 is connected to a plating solution regulating tank 40 (see FIGS. 3 and 22) via a plating solution supply pipe 55. Control valves 56 for controlling the back pressure to be constant are disposed on each of the plating solution supply pipes 55.

Figure 22:
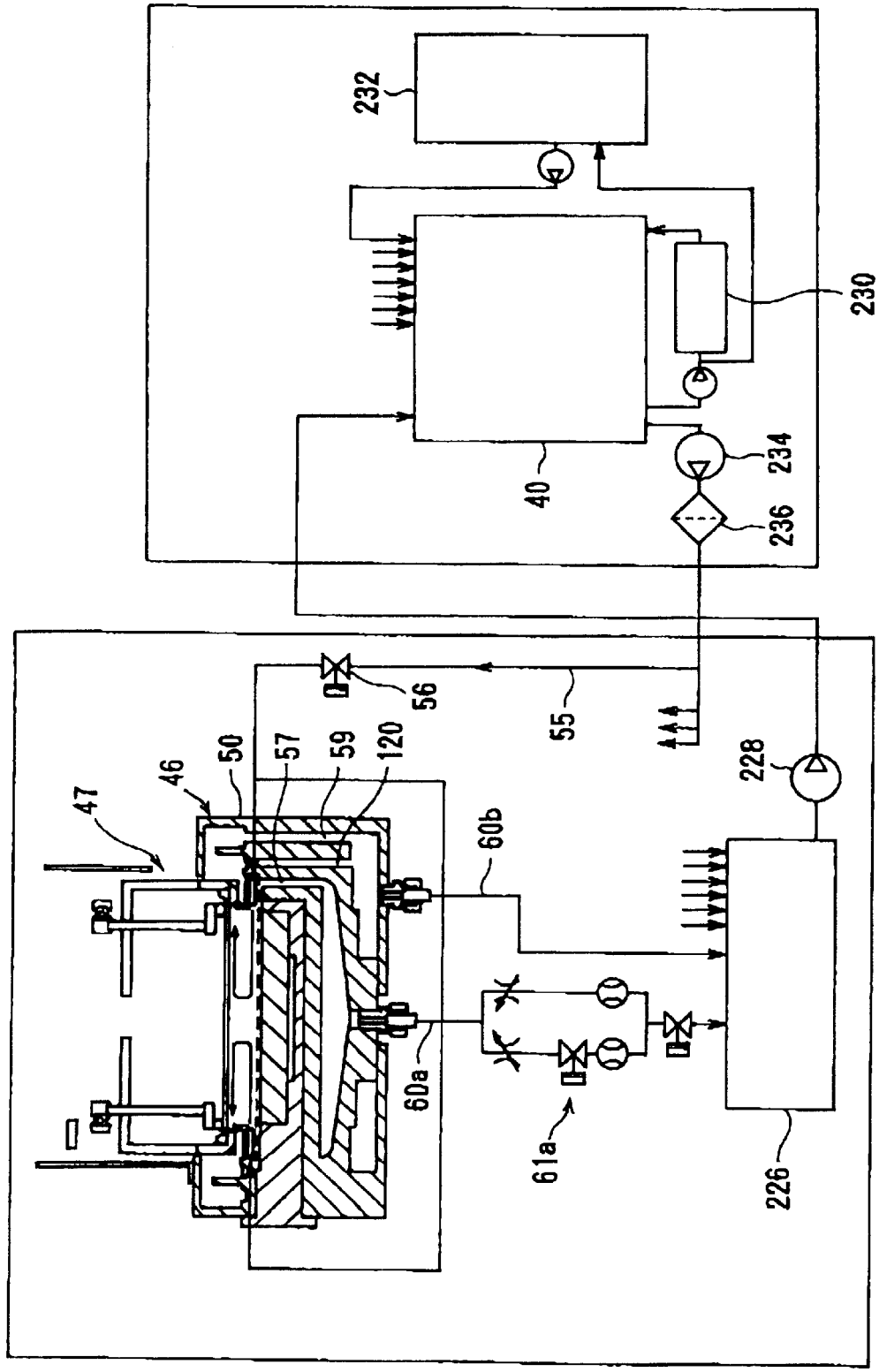
FIG. 22 is a schematic diagram showing a flow of a plating solution in a plating apparatus provided with a plurality of the plating units shown in FIG. 21.

Further, the plating container 50 is provided with first plating solution discharge ports 57 for withdrawing the plating solution 45 in the plating chamber 49 from the peripheral portion of the bottom of the plating chamber 49, and second plating solution discharge ports 59 for discharging the plating solution 45 overflowing a weir member 58 provided at the upper end of the plating container 50. Each of the first plating solution discharge ports 57 is connected to a reservoir 226 (see FIG. 22) via a plating solution discharge pipe 60a. A flow controller 61a is disposed on the plating solution discharge pipe 60a. On the other hand, each of the second plating solution discharge ports 59 is connected to the reservoir 226 via a plating solution discharge pipe 60b. A flow controller 61b is disposed on the plating solution discharge pipe 60b. The flow controller 61 b may not be provided, as shown in FIG. 22. The plating solution fed into the reservoir 226 is supplied to the plating solution regulating tank 40 (see FIG. 3) from the reservoir 226 by a pump 228. In the plating solution regulating tank 40, the temperature of the plating solution is adjusted, and the concentration of various components in the plating solution is measured and adjusted. Thereafter, the plating solution is supplied to the plating units (see FIG. 22).

As shown in FIG. 6, a plurality of the first plating solution discharge ports 57 (16 ports in FIG. 6), which are in circular form having a diameter of 16 mm to 20 mm, for example, are disposed at equal intervals along the circumferential direction. A plurality of the second plating solution discharge ports (3 ports in FIG. 6) 59 are in arc-shaped form having a central angle of about 25°.

The plating solution 45 ejected from the plating solution supply nozzles 53 is discharged to the reservoir 226 (see FIG. 22) from one or both of the first plating solution discharge ports 57 and the second liquid discharge ports 59, thereby keeping the liquid level of the plating solution 45 in the plating chamber 49 at a constant value.

As shown in FIG. 6, a lateral hole 204 extended in the horizontal direction is provided at a predetermined position along the vertical direction in the vicinity of the bottom of the plating chamber 49. A liquid level sensor 206 is provided in the side wall of the plating chamber 49. The liquid level sensor 206 has a front end (lower end) reaching the lateral hole 204 and detects whether the liquid level of the plating solution is lower than the position of the lateral hole 204 or not. For example, the front end of the liquid level sensor 206 is formed of Teflon, and, when the front end of the liquid level sensor 206 is in the air, the difference in refractive index between Teflon and air is so large that a beam of light is returned to an original position (photodetector) due to total reflection. On the other hand, when the front end of the liquid level sensor 206 is dipped in the plating solution, the difference in refractive index between Teflon and the plating solution is so small that the beam of light is almost radiated into the plating solution and is not returned to the original position (photodetector) The liquid level sensor 206 utilizes such properties, for example, and hence detects the presence of the plating solution in the lateral hole 204. The liquid level sensor 206 always monitors whether the liquid level of the plating solution is higher than the minimum liquid level or not. When the liquid level of the plating solution is lower than the minimum liquid level, the flow controller 61*a* disposed on the plating solution discharge pipe 60*a* regulates the plating solution to thus maintain the liquid level of the plating solution.

Further, a vertical stream regulating ring 62 for damming off a flow of the plating solution 45 directed outwardly along the horizontal direction is provided in the plating chamber 49. A horizontal stream regulating ring 63 having an outer circumferential end fixed to the plating container 50 is provided in the plating chamber 49. The vertical stream regulating ring 62 is connected to the inner circumferential end of the horizontal stream regulating ring 63.

The plating solution horizontally ejected from each of the plating solution supply nozzles 53 collides with at the central portion of the plating chamber 49 to form an upward flow and a downward flow. When no substrate is held by the head 47, the upward flow pushes up the liquid surface of the plating solution 45 at the central portion inside the vertical stream regulating ring 62. When the substrate is lowered, the substrate is firstly brought into contact with the plating solution 45 at the central portion pushed up by the upward flow, and hence air bubbles on the lower surface of the substrate are pushed outwardly. On the other hand, the downward flow is changed to a horizontal flow flowing from the central portion of the anode 48 to the peripheral portion of the anode 48 to push away peeled fine pieces of the black film formed on the surface of the anode 48. The peeled pieces of the black film pass from the peripheral portion of the anode 48 through the lower portion of the horizontal stream regulating ring 63 to the first plating solution discharge ports 57, so that the peeled pieces of the black film can be prevented from approaching and being attached to the surface of the substrate to be processed.

In the electroplating, the current density in the plating solution governs the thickness of the plated film. Therefore, in order to make the thickness of the plated film uniform, it is necessary to make the distribution of the current density in the plating solution uniform. In the present embodiment, as described below, since the peripheral portion of the substrate has an electrical contact, the current density of the plating solution present on the peripheral portion of the substrate tends to be increased. Therefore, the vertical stream regulating ring 62 is extended vertically to be disposed in the vicinity of the peripheral portion of the substrate, and the horizontal stream regulating ring 63 is extended horizontally outwardly to be disposed below the vertical stream regulating ring 62, thereby regulating the electric current flowing in the vicinity of the peripheral portion of the substrate. Thus, these stream regulating rings can reduce local concentration of the electric current and can make the current density of the plating solution uniform to thus prevent the plated film from being thick at the peripheral portion of the substrate.

In the present embodiment, the vertical stream regulating ring and the horizontal stream regulating ring are used for regulating the electric current around the peripheral portion of the substrate. However, the present invention is of course not limited to this example.

On the other hand, the head 47 is provided with a rotatable housing 70 in a hollow cylindrical form and a disk-shaped substrate table 71 for holding a substrate W on its lower surface which table 71 is rotated together with the housing 70. A ring-shaped substrate holding member 72 projecting radially inwardly is provided at the lower end of the housing 70. For example, the substrate holding member 72 is formed of a packing material and has a tapered surface on a part of its inner circumferential surface for guiding the substrate W. The peripheral portion of the substrate W is held between the substrate holding member 72 and the substrate table 71. The substrate table 71 is constituted as a pressing member for pressing the substrate W against the substrate holding member 72.

FIG. 5 is an enlarged view showing a part of the head 47. As shown in FIG. 5, a ring-shaped lower sealing member 73 is mounted on the substrate holding member 72. The lower sealing member 73 projects inwardly, and the front end of its upper surface projects upwardly in an annular tapered form. An upper sealing member 74 is mounted on the peripheral portion of the lower surface of the substrate table 71. A part of the upper sealing member 74 projects downwardly from the lower surface of the substrate table 71. Thus, when the substrate W is held by the substrate holding member 72, the lower surface of the substrate W is brought into pressure contact with the lower sealing member 73, and the upper surface of the substrate W is brought into pressure contact with the upper sealing member 74, thereby reliably sealing the plating chamber 49.

In the present embodiment, eighty air vent holes 75 having a diameter of 3 mm are formed in the substrate holding member 72 at equal intervals along the circumferential direction. Each of the air vent holes 75 is extended horizontally outwardly and further extended outwardly in an upwardly inclined state. The air vent holes 75 are provided in such a state that, when the head 47 is located in the plating position as shown in FIG. 4, about half of the peripheral opening end of the air vent hole 75 is exposed to the exterior from the liquid surface of the plating solution 45 in the plating chamber 49. As described above, the upward flow of the plating solution 45 in the plating chamber 49 is brought into contact with the substrate W to sweep away air bubbles to the exterior from the central portion of the substrate W. Accordingly, the air bubbles swept by the upward flow are successively discharged to the exterior through the air vent holes 75. Thus, air bubbles can be prevented from remaining between the substrate W and the surface of the plating solution 45.

For example, the angle $\theta$ of inclination of the air vent holes 75 is set to be 30°. When the venting of air is taken into consideration, the air vent holes 75 should preferably have a diameter of 2 mm to 5 mm, and more preferably about 3 mm. Further, the air vent holes 75 should preferably be inclined upwardly in the outward direction at an angle of not less than 20°, and more preferably about 30°.

Further, the peripheral opening end of the air vent holes 75 may be located fully above the liquid surface of the plating solution at the time of plating. The air vent holes 75 may be branched into two holes, one of which is opened in the vicinity of the liquid surface, and the other of which is opened at a position fully above the liquid surface. It has been confirmed that, when a gap S between the lower surface of the substrate W held on the lower surface of the substrate table 71 and the upper end of the air vent holes 75 is not more than about 1.5 mm, air can be vented in a short time.

Each of the air vent holes 75 may be provided in any form, e.g., in a linear form, or each of the air vent holes 75 may be branched outwardly into two holes.

Further, plate-spring-like contacts 76 for a cathode electrode are disposed on the substrate holding member 72 in the housing 70. When the substrate W is held on the lower surface of the substrate table 71, the contacts 76 for a cathode electrode energize the substrate W. Feeding contacts (probes) 77 are vertically downwardly provided at the outer circumferential side of the substrate table 71. When the substrate table 71 is lowered, each of the feeding contacts 77 feeds power to each of the contacts 76 for a cathode electrode. Since the plating solution 45 is sealed with a lower sealing member 73 disposed between the substrate W and the substrate holding member 72, the contacts 76 for a cathode electrode and the feeding contacts 77 can be prevented from coming into contact with the plating solution 45.

Figure 7:
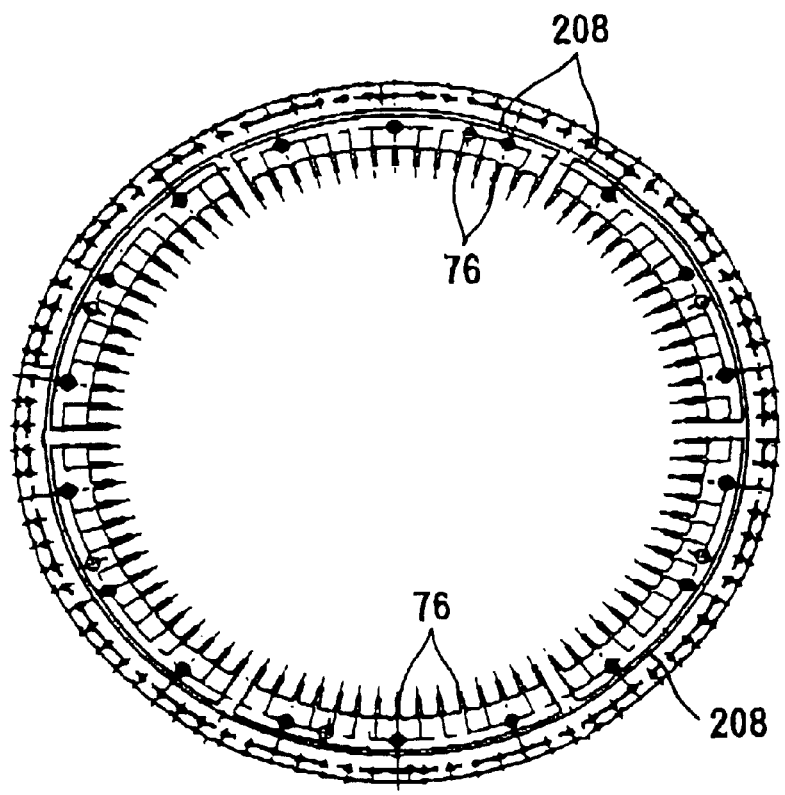
FIG. 7 is a plan view showing an arrangement of contacts for cathode electrodes.

In the present embodiment, as shown in FIG. 7, six circumferentially divided cathode electrode plates 208 are provided, and each of the cathode electrode plates 208 is provided with fifteen contacts 76 extended inwardly for a cathode electrode. Power is respectively fed from each of the feeding contacts 77 to each of the cathode electrode plates 208, thereby making the distribution of the voltage uniform.

Figure 8:
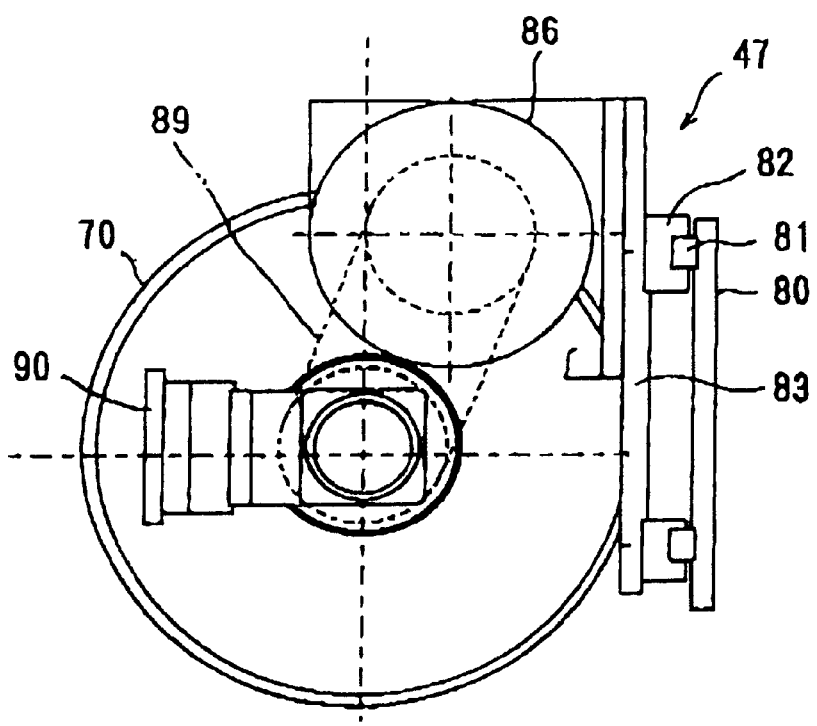
FIG. 8 is a plan view showing a head in the plating unit.
Figure 9:
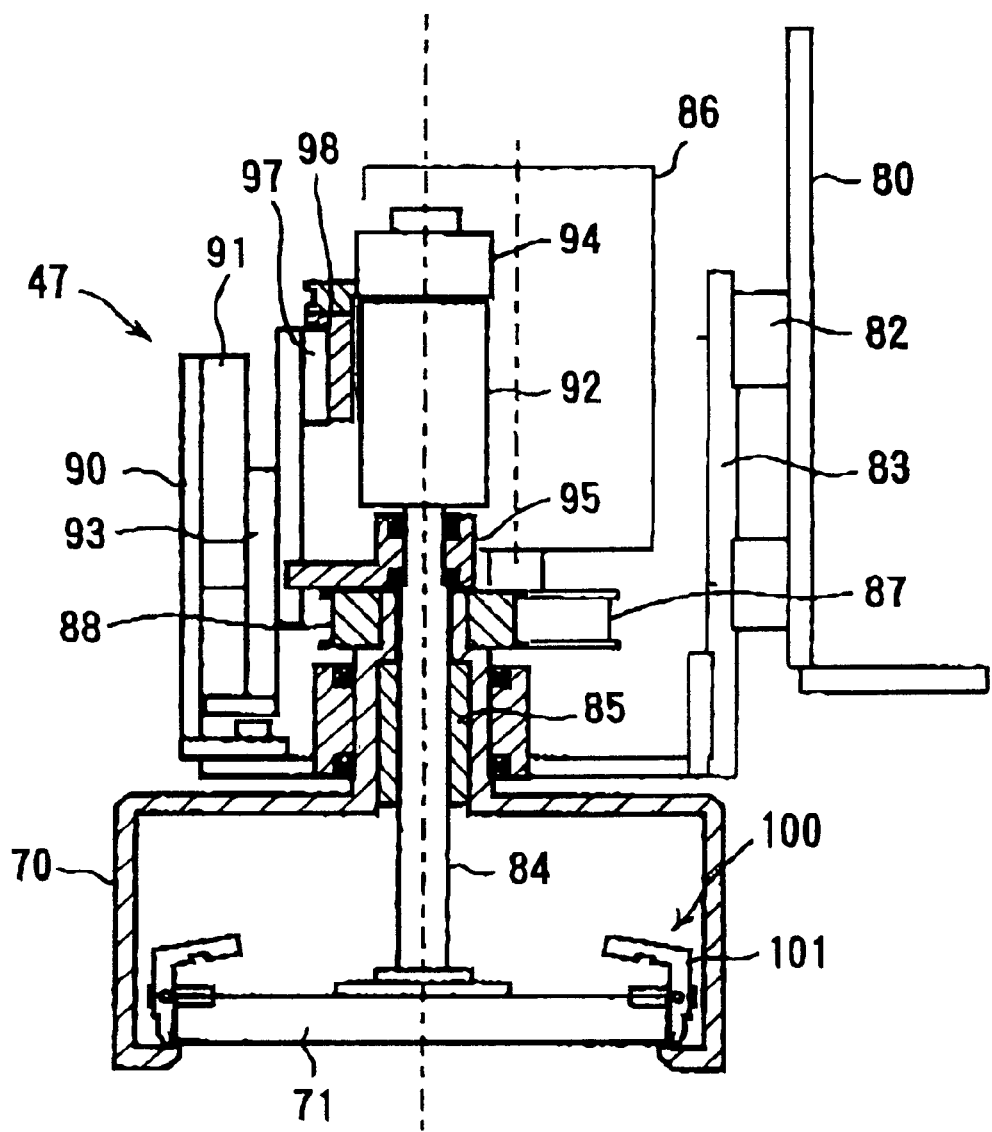
FIG. 9 is a front view of the head shown in FIG. 8.

FIGS. 8 and 9 show the whole structure of the head 47. The head 47 has a base 83 mounted on sliders 82, which are vertically movable with rotation of a ball screw, for example, along rails 81 fixed to a fixed frame 80. The housing 70 is rotatably supported on the base 83. On the other hand, the substrate table 71 is connected to the lower end of a table shaft 84 extended concentrically through the interior of a shaft in the housing 70. The table shaft 84 has a spline 85 so as not to be rotated. So that the housing 70 and the table shaft 84 are rotated together and vertically movable relative to each other.

Figure 10:
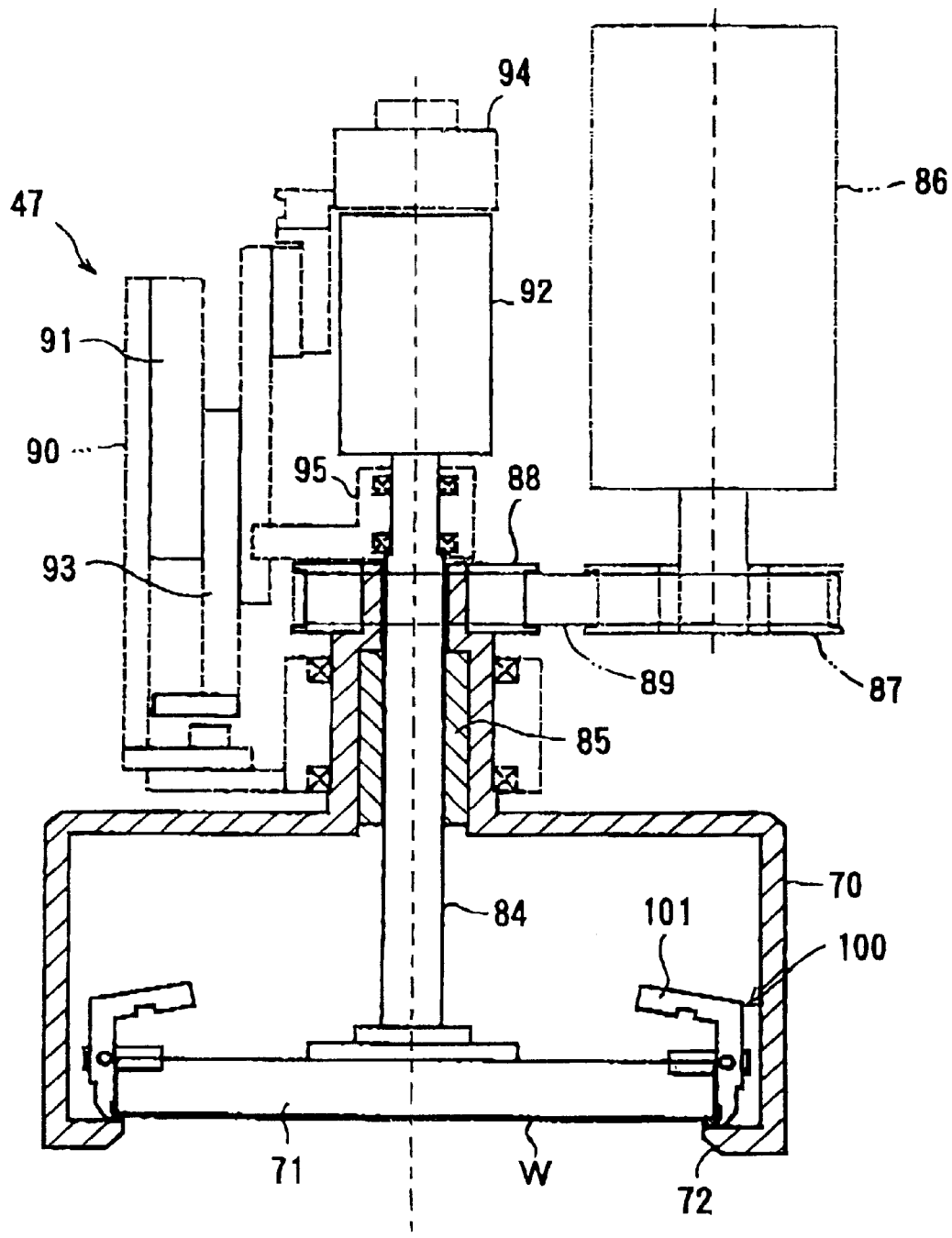
FIG. 10 is a front view explanatory of the rotation of the head in the plating unit.

A servomotor 86 is mounted on the base 83. A timing belt 89 is provided between a drive pulley 87 of the servomotor 86 and a driven pulley 88 fixed to the shaft of the housing 70. Thus, upon energization of the servomotor 86, the members indicated by solid lines in FIG. 10, i.e., the housing 70, the table shaft 84, and the substrate table 71, with the substrate W being held thereon are rotated together.

Figure 11:
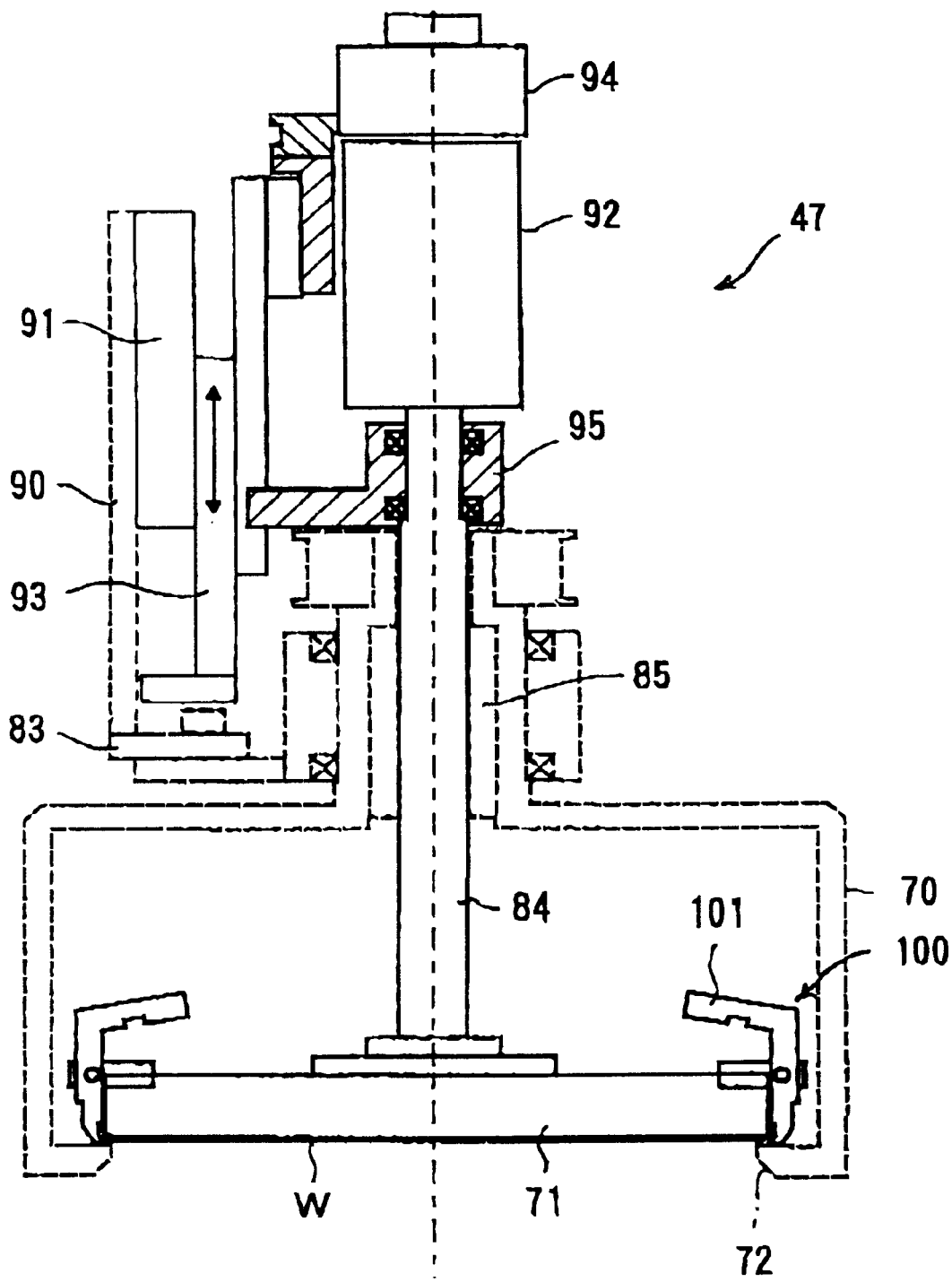
FIG. 11 is a front view explanatory of the raising and lowering of the head in the plating unit.

A bracket 90 is vertically mounted on the base 83, and an actuator 91 using air as a drive source is mounted on the bracket 90. On the other hand, a connector 95 is connected to the upper portion of the table shaft 84. The connector 95, the actuator 91, and an actuator slider 93 are relatively moved in the vertical direction. With this arrangement, members indicated by solid lines in FIG. 11 (except for the actuator), i.e., the table shaft 84, the substrate table 71 and the like are vertically movable.

In order to prevent wear of a rotary joint 94, cause by rotation of the housing 70 at a high speed, an actuator 97 and an actuator slider 98 are provided in order that when liquid is removed from the substrate by rotating the housing 70 at a high speed without supplying current to the substrate, the rotary joint 94 is disengaged from the connector 92. The feeding contacts 77 provided on the substrate table 71 are connected to a cathode of a power supply for plating through the rotary joint 94.

Openings 96 are provided in the cylindrical housing 70 for allowing the substrate W and the robot hand to pass therethrough (see FIGS. 5, 18 to 20).

Figure 12:
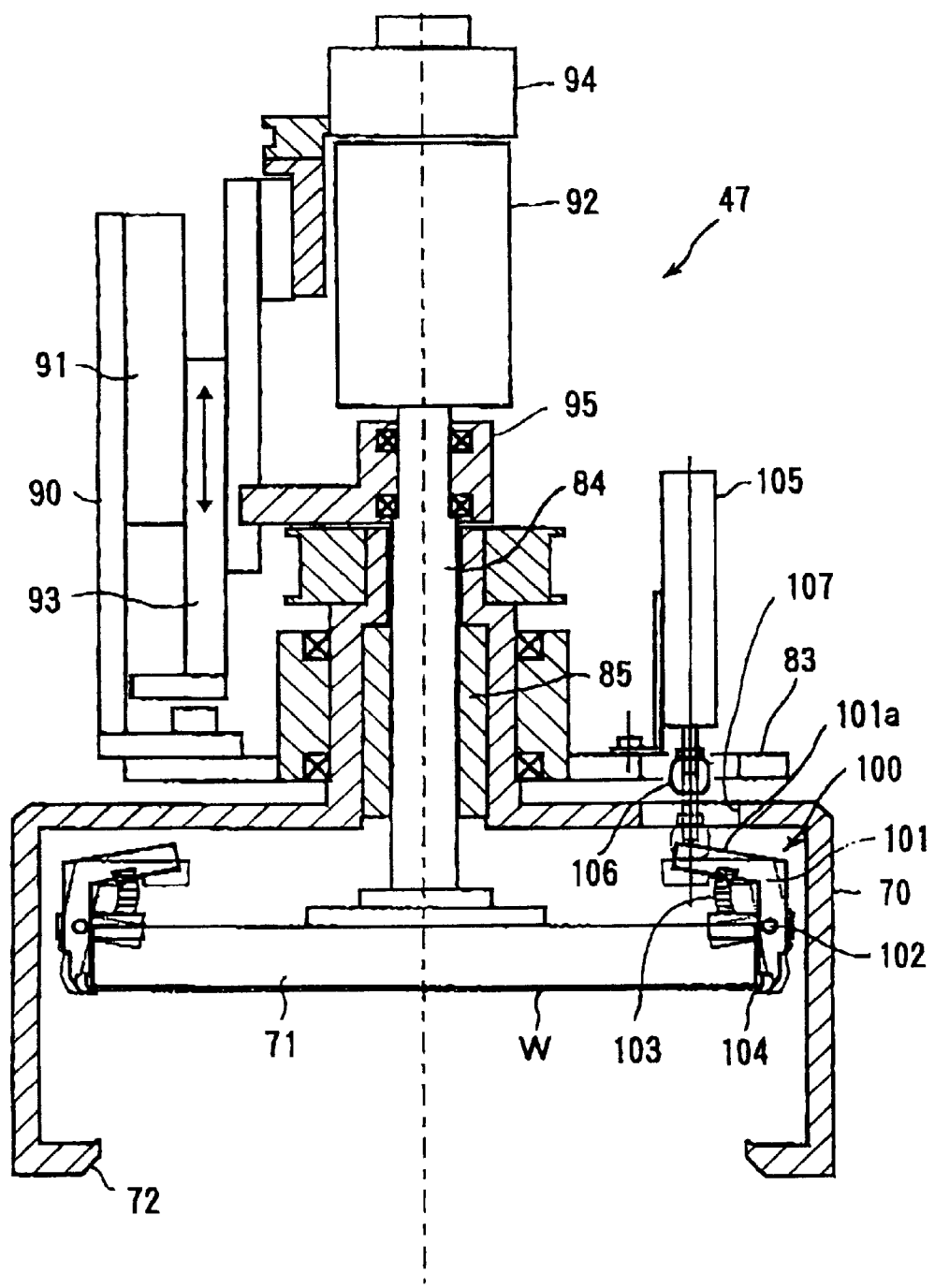
FIG. 12 is a front view explanatory of the raising and lowering of a chuck mechanism in the head of the plating unit.

Chuck mechanisms 100 for holding the substrate W on the lower surface of the substrate table 71 are provided on the peripheral portion of the substrate table 71 at three positions in the circumferential direction of the substrate table 71. Each of the chuck mechanisms 100 has a bell crank-shaped hook 101. As shown in FIGS. 12 and 13, the hook 101 is rotatably supported at its central portion by the substrate table 71 through a pin 102. A compression coil spring 103 is interposed between a lever section 101a extending in the upper inward direction of the pin 102 and the upper surface of the substrate table 71 so as to urge the hook 101 in a closing direction. Thus, normally, by the urging force of the coil spring 103, a claw 104 provided on the lower end of the hook 101 enters a position under the substrate W to hold the substrate W.

On the other hand, at a position above the lever section 101a of the hook 101, a pusher 106, which is vertically moved by actuation of an air cylinder 105, is mounted on the base 83. Thus, when the substrate table 71 is raised, the pusher 106 is lowered, and the hook 101 is rotated in an opening direction against the urging force of the compression coil spring 103, thus releasing the substrate W. An opening 107 is provided at a position facing the pusher 106 in the housing 70 so that the vertical movement of the pusher 106 is allowed.

In this case, when the substrate table 71 is in an upper position, the hook 101 serves to hold the substrate W on the lower surface of the substrate table 71. On the other hand, when the substrate table 71 is lowered to permit the substrate to be sandwiched and held between the upper sealing member 74 of the substrate table 71 and the lower sealing member 73 of the housing 70, adjustment is made so that the hook 101 contacts the substrate table 71 and thus is separated from the substrate W to create a minute gap between the hook 101 and the substrate W, whereby the substrate W is not held by the hook 101.

FIGS. 14 and 15 show the inverter 20 provided in each of the pre-treatment unit 21, the first substrate stage 23b, and the second substrate stage 26b. The inverter 20 comprises a seal case 110 which is rotated by energization of a motor (not shown), a pair of arc-shaped hands 111 which are opened or closed by means of a link mechanism or the like housed within the seal case 110, and chuck rollers 113 which are rotatably mounted on shafts 112 and vertically provided on the hands 111 to hold the peripheral edge of the substrate W. The plane defined by the chuck rollers 113 is located at a position which is offset by a distance e from an axis of the seal case 110.

With this construction, when the hands 111 hold the substrate W and are inverted, the substrate W can be vertically moved by a distance 2e, which is twice the distance e. Thus, when a slit, through which a drive section of the inverter 20 passes, is formed in a splash preventive cover in the pre-treatment unit 21, this opening can be provided above the position of the substrate chuck of the pre-treatment unit 21.

Next, a series of plating processes using the plating apparatus according to this embodiment will be described.

A cassette housing a plurality of substrates whose surfaces (surface on which semiconductor elements are formed, i.e., surface to be processed) face upward is placed on a cassette stages 15 within the housing unit 10. The recess-type hand of the first transfer device 17 is inserted into the cassette and holds the substrate, and then takes out the substrate from the cassette. The first transfer device 17 which holds the substrate by the hand rotates about its own axis and transfers the substrate onto the second substrate stage 26a. Next, the third transfer device 27 holds the substrate placed on the second substrate stage 26a by the recess-type hand, rotates about its own axis, and then transfers the substrate onto the first substrate stage 23a.

The second transfer device 24 moves to a position close to the first substrate stage 23a, and holds the substrate placed on the first substrate stage 23a by the recess-type hand. Thereafter, the second transfer device 24 holding the substrate rotates toward the pre-treatment unit 21, and transfers the substrate to the substrate chuck of the pre-treatment unit 21 through a slit formed in the splash preventive cover for allowing the substrate to pass therethrough.

In the substrate chuck of the pre-treatment unit 21, fingers are opened, and the substrate is positioned between the fingers, and then the fingers are closed to hold the substrate. Next, a pre-treatment liquid nozzle, which has been in the stand-by position so as not to hinder the movement of the hands 111 of the inverter 20, is rotated to a position above and near the center of the substrate. While the substrate chuck holding the substrate is rotated at a medium speed of, for example, about 300 min$^{-1}$, the pre-treatment liquid is supplied through the pre-treatment liquid nozzle onto the substrate. When the liquid has been speedily spread over the entire surface of the substrate, the rotational speed of the substrate is increased to remove excessive pre-treatment liquid on the substrate under a centrifugal force.

After the removal of the liquid from the substrate is completed and the substrate chuck is stopped, the hands 111 of the inverter 20 are lowered. The hands 111 hold the substrate, and the fingers of the substrate chuck in the pre-treatment unit 21 are opened to transfer the substrate to the inverter 20 completely. The inverter 20 is raised to a position where the hands 111 of the inverter 20 do not contact the substrate chuck while an inverting operation is performed. Thereafter, the hands 111 of the inverter 20 and the substrate are rotated by an angle of 180 degrees about the horizontal inverting axis, and the surface of the substrate faces downwardly. The inverter 20 is lowered to a position where the substrate is transferred to the second transfer device 24, and then stopped.

The hands 111 of the inverter 20 are located at a position below the inverting axis when the hands 111 receive the substrate from the third transfer device 27 and receives the substrate from the substrate chuck after the pre-treatment. On the other hand, when the hands 111 are inverted about the inverting axis to transfer the substrate to the second transfer device 24, the hands 111 are located at a position above the inverting axis.

The second transfer device 24 inserts the recess-type hand into the splash preventive cover through the slit formed in the cover. The substrate is held by the hands of the inverter 20. The recess-type hand is positioned so as to allow the hand to contact the lower peripheral edge portion of the substrate. The hands 111 of the inverter 20 release the substrate, and the recess-type hand of the second transfer device 24 holds the substrate with its surface facing downwardly. The second transfer device 24 takes out the substrate from the pre-treatment unit 21, and moves to one predetermined plating unit 22.

The housing 70 and the substrate table 71 in the plating unit 22 are raised by raising the base 83 to a position where the substrate is attached or detached. The substrate table 71 is further lifted by means of the actuator 91 to the upper end of the housing 70. The air cylinders 105 are actuated to lower the pushers 106 to thereby release three hooks 101 provided on the peripheral portion of the substrate table 71.

The second transfer device 24 inserts the hand and the substrate into the housing 70 through the opening 96 formed in the housing 70, and lifts the hand to a position immediately below the substrate table 71. In this state, the pushers 106 are raised, and the hooks 101 are closed by the urging forces of the compression coil springs 103 provided between the lever sections 101a of the hooks 101 and the upper surface of the substrate table 71 to thus hold the substrate. After the substrate is held by the hooks 101, the hand of the second transfer device 24 is slightly lowered and withdrawn through the opening 96 of the housing 70.

Next, the substrate table 71 is lowered by the actuator 91, and the substrate is centered by the tapered portion on the inner side of the substrate holding member 72 in the housing 70, placed on the lower sealing member 73 of the substrate holding member 72, and further pressed against the upper sealing member 74 near the peripheral portion of the substrate table 71 to form a seal for preventing the plating solution from entering the electrode contact side. At the same time, the substrate table 71 is lowered to press the feeding contacts 77 against the contacts 76 for a cathode electrode, thereby achieving reliable contacts.

In this case, the hooks 101 hold the substrate in such a manner that the substrate is placed on the hooks 101. When the substrate table 71 is raised from the housing 70, the substrate is held by the upper sealing member 74 to such an extent that play does not occur. On the other hand, when the substrate table 71 is lowered, and the substrate is sealed by the lower sealing member 73 and the upper sealing member 74, the substrate is stably held therebetween by allowing the upper sealing member 74 to be deformed. In this case, the hooks 101 are stopped by the substrate table 71 and are in a position slightly away from the substrate W so that the hooks 101 do not hold the substrate. Therefore, the substrate is equally held by the lower sealing member 73 and the upper sealing member 74 without the influence of the three hooks 101.

In this state, when the plating solution is ejected through the plating solution supply nozzles 53 in the plating process container 46, the liquid surface in its center portion rises. At the same time, while the servomotor 86 is energized to rotate the housing 70, the substrate W and the substrate table 71 at a medium speed of, for example, 150 min$^{-1}$, the base 83 is lowered by a ball screw or the like. The rotational speed of the substrate is preferably about 100 to 250 min$^{-1}$ from the viewpoint of the removal of air. In this case, after the central portion of the substrate comes into contact with the surface of the plating solution 45, the area of contact between the substrate and the raised liquid surface increases gradually, and then the plating solution 45 reaches the periphery of the substrate. In the periphery of the lower surface of the substrate, the lower sealing member 73 projects from the substrate surface, and hence air is likely to be left on the periphery of the lower surface of the substrate. However, by allowing the plating solution containing air bubbles to flow to the exterior through air vent holes 75 by the rotation of the housing 70, air bubbles present on the lower surface of the substrate can be removed. Thus, air bubbles on the lower surface of the substrate can be completely removed, and uniform plating can be realized. The predetermined position where the substrate is plated is such that the substrate is immersed in the plating solution 45 within the plating chamber 49 and the plating solution does not enter the housing 70 through the openings 96 of the housing 70.

When the substrate is lowered to a predetermined position, the housing 70 is rotated at a medium speed for several seconds to remove air. The rotational speed of the housing 70 is then changed to a low rotational speed of, for example, 100 min$^{-1}$, and current flows for electroplating by utilizing the above anode and the treating face of the substrate as the cathode. In this case, the rotational speed is in the range of, for example, 0 to 225 min$^{-1}$. During the plating process, the plating solution is continuously fed at a predetermined flow rate through the plating solution supply nozzles 53, is discharged through the first plating solution discharge ports 57 and the second plating solution discharge ports 59, and is circulated through the plating solution regulating tank 40. In this case, since the plating thickness is determined by the current density and the current feed time, the current feed time (plating time) is set according to a desired amount of deposition.

This plating time is, for example, 120 to 150 seconds. The plating process is carried out, for example, at about 1 A (ampere) for about 40 seconds, and then, for example, at about 7.4 A for remaining time.

After the completion of the feed of current, the base 83 is raised to lift the housing 70, the substrate W and the substrate table 71 to a position above the surface of the plating solution 45 within the plating chamber 49 and below the upper end of the plating process container cover. Then, the substrate is rotated at a high speed of, for example, 500 to 800 min$^{-1}$ to remove the plating solution from the substrate under centrifugal force. After the completion of the removal of the liquid from the substrate, the rotation of the housing 70 is stopped so that the housing 70 faces a predetermined direction. The base 83 is then raised to lift the housing 70 to a position where the substrate is attachable or detachable. After the housing 70 is lifted to the position where the substrate is attachable or detachable, the substrate table 71 is further raised by the actuator 91 to a position where the substrate is attachable or detachable.

When the surface of the plating solution is raised, the feed rate of the plating solution is about 10 to 30 liters/min (preferably 20 liters/min), and the plating solution is discharged through the first plating solution discharge ports 57 at a rate of about 3 to 6 liters/min (preferably 5 liters/min). During plating, the feed rate of the plating solution is about 8 to 20 liters/min (preferably 10 liters/min), and the plating solution is discharged through the first plating solution discharge ports 57 at a rate of about 3 to 6 liters/min (preferably 5 liters/min), and through the second plating solution discharge ports 59 at a rate of about 3 to 6 liters/min (preferably 5 liters/min). When the liquid level is lowered after plating, the feed rate of the plating solution is about 15 to 30 liters/min (preferably 20 liters/min), and the plating solution is discharged through the first plating solution discharge ports 57 at a rate of about 20 to 30 liters/min (preferably 25 liters/min). During stopping of the plating process for a long period of time, the plating solution is fed at a rate of about 2 to 4 liters/min (preferably 3 liters/min), and entirely flows and circulates through the second plating solution discharge ports 59.

Next, the hand of the second transfer device 24 is inserted into the housing 70 through the opening 96 of the housing 70, and is raised to a position where the hand receives the substrate. The pushers 106 are then lowered to push the lever sections 101a of the hooks 101 and open the hooks 101, whereby the substrate held by the hooks 101 is dropped on the recess-type hand. In this state, the hand is slightly lowered, and the hand and the substrate held by the hand are taken out through the opening 96 of the housing 70. The substrate is held in such a manner that the surface of the substrate faces downwardly and only the peripheral edge of the substrate is brought into contact with the hand, as with mounting the substrate with the hand.

The substrate held by the second transfer device 24 is transferred to the inverter 20 in the first substrate stage 23b in such a state that the surface of the substrate faces downwardly. The inverter 20 holds the periphery of the substrate by the two hands 111, and ultrapure water is supplied to both surfaces of the substrate to rinse the substrate. And then the substrate is rotated by 180 degrees around the horizontal inverting axis so that the surface of the substrate faces upwardly. Next, the third transfer device 27 holds the substrate placed on the inverter 20 in the first substrate stage 23b by the hand, and transfers the substrate to the chemical liquid cleaning unit 25.

In the chemical liquid cleaning unit 25, the substrate is held by six fingers, and the substrate is rotated so that the surface of the substrate faces upwardly, and then the surface, edge and backside of the substrate are cleaned with a chemical liquid. After the completion of cleaning of the substrate with the chemical liquid, the substrate is rinsed with ultrapure water, and then the substrate held by the fingers is rotated at a high speed to remove the liquid from the substrate.

After the completion of the removal of the liquid from the substrate, the third transfer device 27 takes out the substrate with the hand in such a state that the surface of the substrate faces upwardly. The substrate is then placed on the second substrate stage 26b. In the second substrate stage 26b, the substrate is further rinsed with ultrapure water.

Next, the first transfer device 17 receives the substrate from the second substrate stage 26b with the hand, and transfers the substrate to the cleaning and drying unit 16. In the cleaning and drying unit 16, the surface and backside of the substrate are rinsed with ultrapure water such as deionized water, and then the substrate is rotated at a high speed to remove the liquid from the substrate and then to be dried. The first transfer device 17 holds the substrate with the hand in such a manner that the surface of the substrate faces upwardly, and transfers the substrate at a predetermined position in the cassette on the cassette stage 15.

Figure 16:
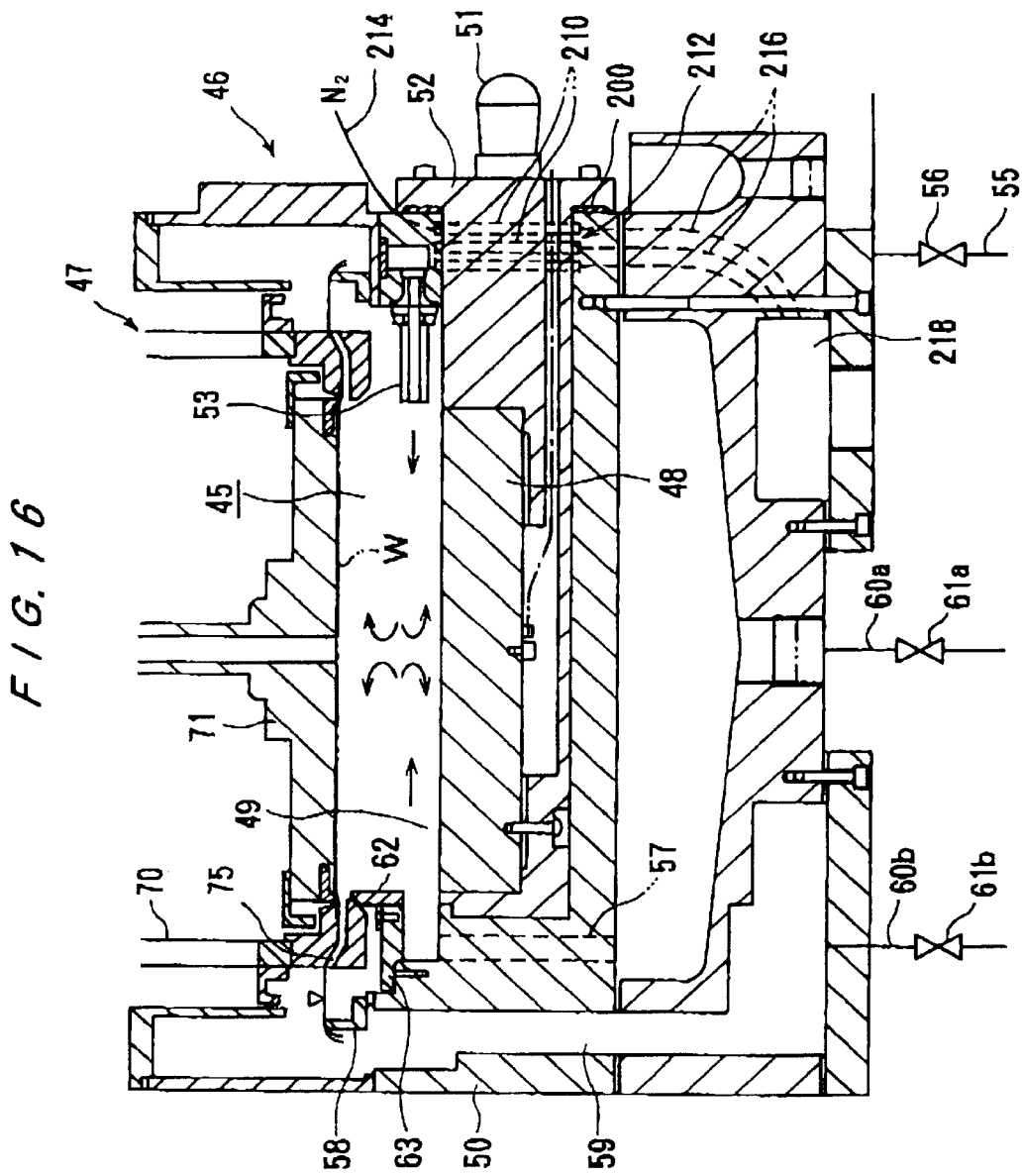
FIG. 16 is a cross-sectional view schematically showing a plating unit in a plating apparatus according to a second embodiment of the present invention.

FIG. 16 shows an essential part of the plating apparatus according to the second embodiment of the present invention. This embodiment is different from the first embodiment in the following: A labyrinth seal 212 comprising a large number of grooves 210 arranged in parallel is provided around the inlet of the anode support 52 which is removably mounted in the plating container 50 through a knob 51 and holds an anode 48. An inert gas introduction passage 214 for introducing inert gas such as nitrogen gas is connected to one of the grooves 210, first ends of plating solution return passages 216 are connected to the bottoms of all the grooves 210, and the other ends of the plating solution return passages 216 are connected to a plating solution reservoir 218 which stores an overflowed plating solution and is open to the air. The remaining construction is the same as that of the first embodiment.

Thus, the provision of the labyrinth seal 212 comprising a plurality of grooves 210 around the inlet of the anode support 52 in the plating container 50 can eliminate the need to tighten the sealing member 200 with large force, and can ensure reliable sealing of the gap between the plating container 50 and the anode support 52 to prevent the plating solution from leaking out. The inert gas introduction passage 214 is connected to one of the grooves 210, the plating solution return passages 216 are connected to the bottoms of all the grooves 210, and inert gas, such as nitrogen gas, having a pressure high enough to discharge the plating solution remaining within the grooves 210 is introduced to the groove 210 through the inert gas introduction passage 214. Thus, the plating solution remaining within the grooves 210 can be discharged to the exterior, and a deterioration in the effect of the labyrinth seal 212 by the plating solution remaining within the groove 210 can be prevented.

In this embodiment, the labyrinth seal 212 comprising a plurality of grooves 210 is provided on the plating container side. Alternatively, the labyrinth seal may be provided on the anode support side or on both the plating container side and the anode support side.

Figure 17:
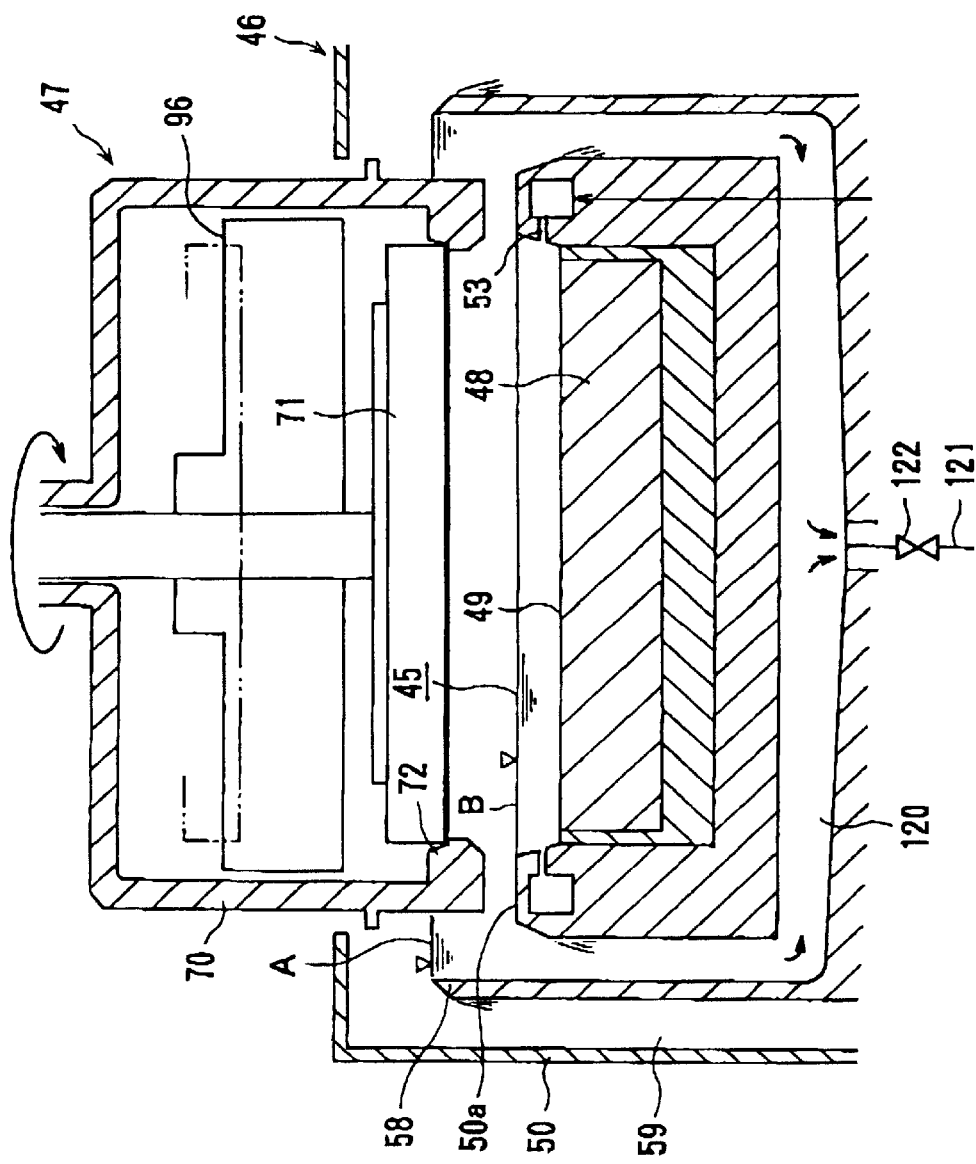
FIG. 17 is a cross-sectional view schematically showing a plating unit in a plating apparatus according to a third embodiment of the present invention.

FIG. 17 schematically shows a plating unit in the plating apparatus according to the third embodiment of the present invention. In the plating unit of the first embodiment, the transfer of the substrate is performed by moving the housing 70 up and down. In the plating unit of the third embodiment, the liquid level of the plating solution within the plating process container is raised or lowered to transfer the substrate without the vertical movement of the housing 70.

When this plating unit is provided, the second transfer device 24 shown in FIG. 2, which is a mobile type and rotatable, may have a suction-type hand which holds the substrate by suction, and is rotatable to change the suction surface of the suction-type hand t face upwardly or downwardly.

The plating unit according to this embodiment will be described below. The parts or components identical to or corresponding to the parts or components in the plating units according to the above embodiments are denoted by the same reference numerals, and a part of the explanation thereof will be omitted.

The plating unit 22 comprises a plating process container 46 and a head 47. The plating container 50 in the plating process container 46 has first plating solution discharge ports (not shown) which are located around the anode 48 and are opened at the bottom of the plating container 50, and second plating solution discharge ports 59 for discharging the plating solution 45 which has overflowed a weir member 58 in the plating container 50. Further, the plating container 50 has third plating solution discharge ports 120 which are open at a step portion 50a provided in the circumferential wall of the weir member 58. A shut-off valve 122 is provided in a plating solution discharge pipe 121 extending from the third plating solution discharge ports 120 to the reservoir 226 (see FIG. 22).

With this construction, a plane defined by the upper end of the weir member 58 in the plating container 50 constitutes a liquid level A for plating, while a plane defined by the step portion 50a constitutes a liquid level B for transferring the substrate. Specifically, at the time of plating process, the shut-off valve 122 is closed, and the plating solution is ejected through the plating solution supply nozzles 53 to raise the liquid level of the plating solution 45 within the plating chamber 49, and overflows the upper end of the weir member 58 in the plating container 50, thereby maintaining the liquid level at the liquid level A for plating. After the completion of the plating process, the shut-off valve 122 is opened to discharge the plating solution 45 within the plating chamber 49 through the third plating solution discharge ports 120, thereby bringing the liquid level to the liquid level B for transferring the substrate.

Thus, by immersing the anode 48 in the plating solution 45 over a period other than during the plating process, a black film formed on the surface of the anode 48 can be prevented from being dried and oxidized, and the plating process can be stably carried out.

When the substrate W is held by the substrate holding member 72 provided at the lower end of the housing 70, the housing 70 of the head 47 is not vertically movable, but is rotatable about its own axis, and the substrate W is located at a position between the liquid level A for plating and the liquid level B for transferring the substrate. The substrate table 71 is not provided with any means for holding the substrate, and the substrate W is placed on the substrate holding member 72 of the housing 70, and then the substrate table 71 is lowered to sandwich the peripheral portion of the substrate W between the substrate holding member 72 and the lower peripheral portion of the substrate table 71, thereby holding the substrate W.

Next, a plating process performed by the plating apparatus according to this embodiment will be described below. This embodiment is substantially the same as the first embodiment, except for transfer of the substrate through the second transfer device 24 and the process in the plating unit 22. Therefore, only the different construction and operation will be described.

First, the substrate placed on the first substrate stage 23a in such a manner that the surface of the substrate faces upwardly, is transferred to the pre-treatment unit 21 in the following manner: The second transfer device 24 holds the substrate in such a manner that the suction-type hand with the suction surface facing upward attracts the backside of the substrate by suction, and rotates toward the pre-treatment unit 21. The substrate and the suction-type hand are inserted into the pre-treatment unit 21 through a slit formed in the splash preventive cover in the pre-treatment unit 21, and the substrate is positioned between two opened hands 111 of the inverter 20 in the pre-treatment unit 21.

Further, the second transfer device 24 receives the substrate from the pre-treatment unit 21 in the following manner: The suction-type hand of the second transfer device 24 with the suction surface facing downward is inserted into the pre-treatment unit 21 through the slit of the splash preventive cover in the pre-treatment unit 21. The suction-type hand is then positioned immediately above the substrate held by the hands 111 of the inverter 20 in the pre-treatment unit 21. The suction-type hand attracts the backside of the substrate by vacuum suction, and the hands 111 of the inverter 20 are opened. Thus, the substrate with the surface facing downward is held completely by the suction-type hand of the second transfer device 24.

The substrate is transferred to the plating unit 22 in the following manner: The suction-type hand of the second transfer device 24 and the substrate W held by the suction-type hand in such a manner the surface of the substrate faces downwardly, are inserted into the housing 70 through the opening 96 of the housing 70. The suction-type hand is then moved downwardly, and the vacuum suction is released to place the substrate W on the substrate holding member 72 of the housing 70. Thereafter, the suction-type hand is raised and withdrawn from the housing 70. Next, the substrate table 71 is lowered to sandwich the peripheral portion of the substrate W between the substrate holding member 72 and the lower peripheral portion of the substrate table 71, thereby holding the substrate W.

Thereafter, the plating solution discharge pipe 121 connected to the third plating solution discharge ports 120 are closed by the shut-off valve 122, and the plating solution is ejected through the plating solution supply nozzles 53. At the same time, the housing 70 and the substrate W held by the housing 70 are rotated at a medium speed. After the plating solution reaches a predetermined level and several seconds have elapsed, the rotational speed of the housing 70 is changed to a low rotational speed of, performing electroplating by utilizing the anode 48 as the anode and the processing face of the substrate as the cathode.

After the completion of the supply of current, the shut-off valve 122 is opened to discharge, through the third plating solution discharge ports 120, the plating solution 45 present at a position above the step portion 50a to the reservoir. Thus, the housing 70 and the substrate held by the housing 70 are located above the liquid level of the plating solution and exposed to the atmosphere. In the state that the housing 70 and the substrate W held by the housing 70 are located above the liquid level of the plating solution, the housing 70 and the substrate are rotated at a high speed of, for example, 500 to 800 $min^{-1}$ to remove the plating solution from the substrate under a centrifugal force. After the completion of the removal of the plating solution from the substrate, the rotation of the housing 70 is stopped at a position where the housing 70 faces a predetermined direction.

After the rotation of the housing 70 is completely stopped, the substrate table 71 is raised to a position where the substrate is detached or attached. Next, the suction-type hand of the second transfer device 24 with the suction surface facing downwardly is inserted into the housing 70 through the opening 96 of the housing 70, and is lowered to a position where the suction-type hand can hold the substrate by suction. The substrate is then held by vacuum suction by the suction-type hand, and the suction-type hand is then moved to a position above the opening 96 of the housing 70. Thereafter, the suction-type hand and the substrate held by the suction-type hand are withdrawn from the housing 70 through the opening 96 of the housing 70.

According to this embodiment, the mechanism of the head 47 can be simplified and compact. In addition, the plating process is carried out when the surface of the plating solution within the plating process container 46 is on a liquid level A for plating, while the substrate is dewatered and transferred when the surface of the plating solution is on a liquid level B for transferring the substrate. Further, it is possible to prevent a black film formed on the surface of the anode 48 from being dried and oxidized. Further, since the position of the substrate which is plated is the same as the position of the substrate from which an excessive plating solution is removed by rotation of the substrate, the position for performing mist-splash prevention can be lowered.

Furthermore, in this embodiment, the following process may be performed: When the surface of the plating solution is on the liquid level B for transferring the substrate, the substrate W is inserted into the housing 70 and held by the housing 70, and then the liquid level of the plating solution is raised to the liquid level A for plating. At the same time, the housing 70 is raised by a certain distance. After the surface of the polishing solution is raised to the liquid level A for plating, the housing 70 is rotated at a medium speed of, for example, 150 $min^{-1}$ and lowered, whereby the substrate W is brought into contact with the surface of the plating solution which rises at its central portion. Thus, air bubbles on the surface of the substrate can be positively removed therefrom.

Figure 18:
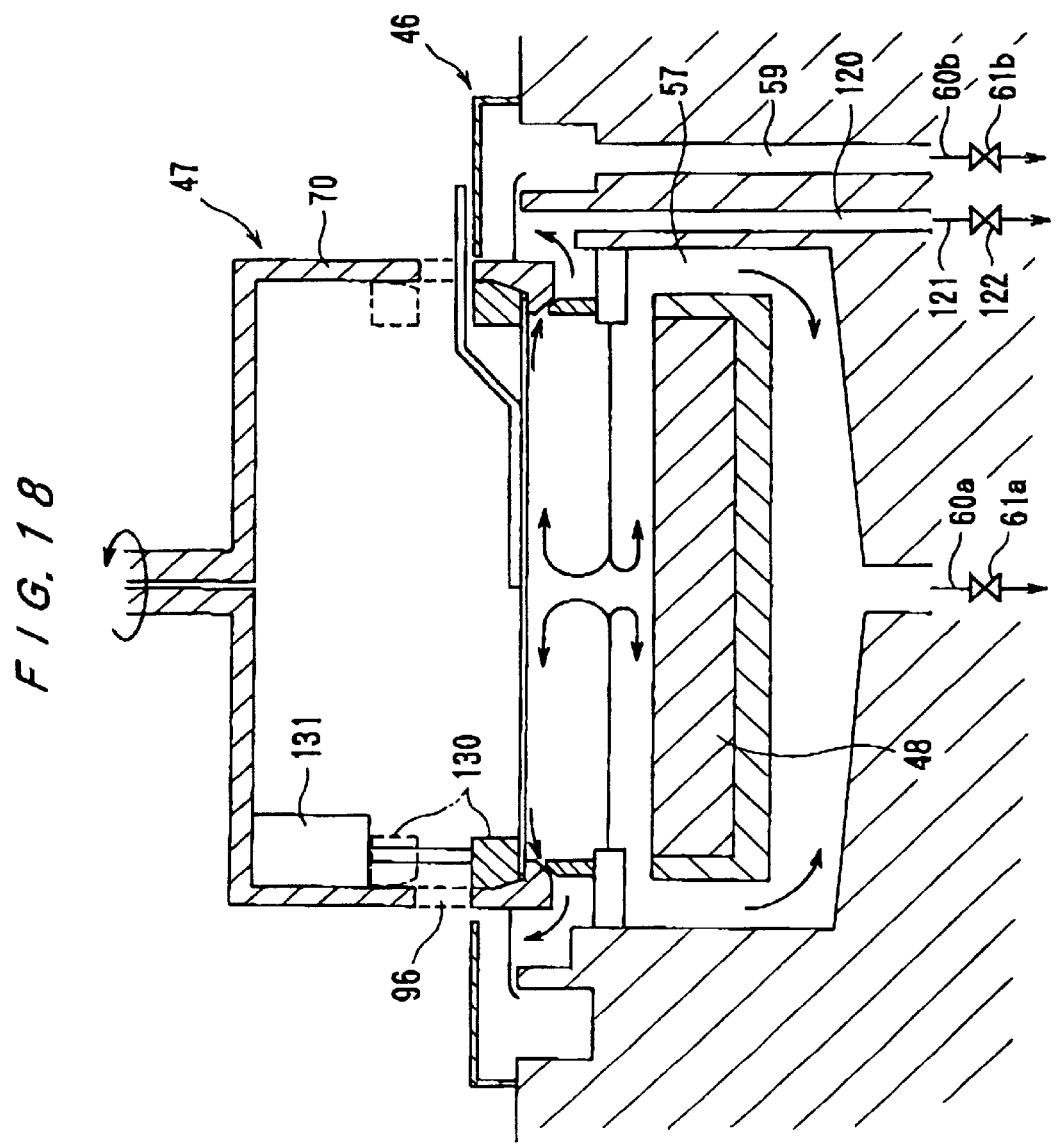
FIG. 18 is a cross-sectional view schematically showing a plating unit in a plating apparatus according to a fourth embodiment of the present invention.

FIG. 18 shows a plating unit in the plating apparatus according to the fourth embodiment of the present invention. The construction of this embodiment is substantially the same as that of the third embodiment, except that a pressing ring 130 is used, instead of the substrate table 71 constituting a pressing member for pressing the substrate against the substrate holding member in the third embodiment, and actuators 131 such as a cylinder for vertically moving the pressing ring 130 are housed in the housing 70.

According to this embodiment, when the actuators 131 are actuated to lower the pressing ring 130, the peripheral portion of the substrate is sandwiched between the substrate holding member 72 of the housing 70 and the lower surface of the pressing ring 130, and hence the substrate W is held. The substrate can be released by raising the pressing ring 130.

Figure 19:
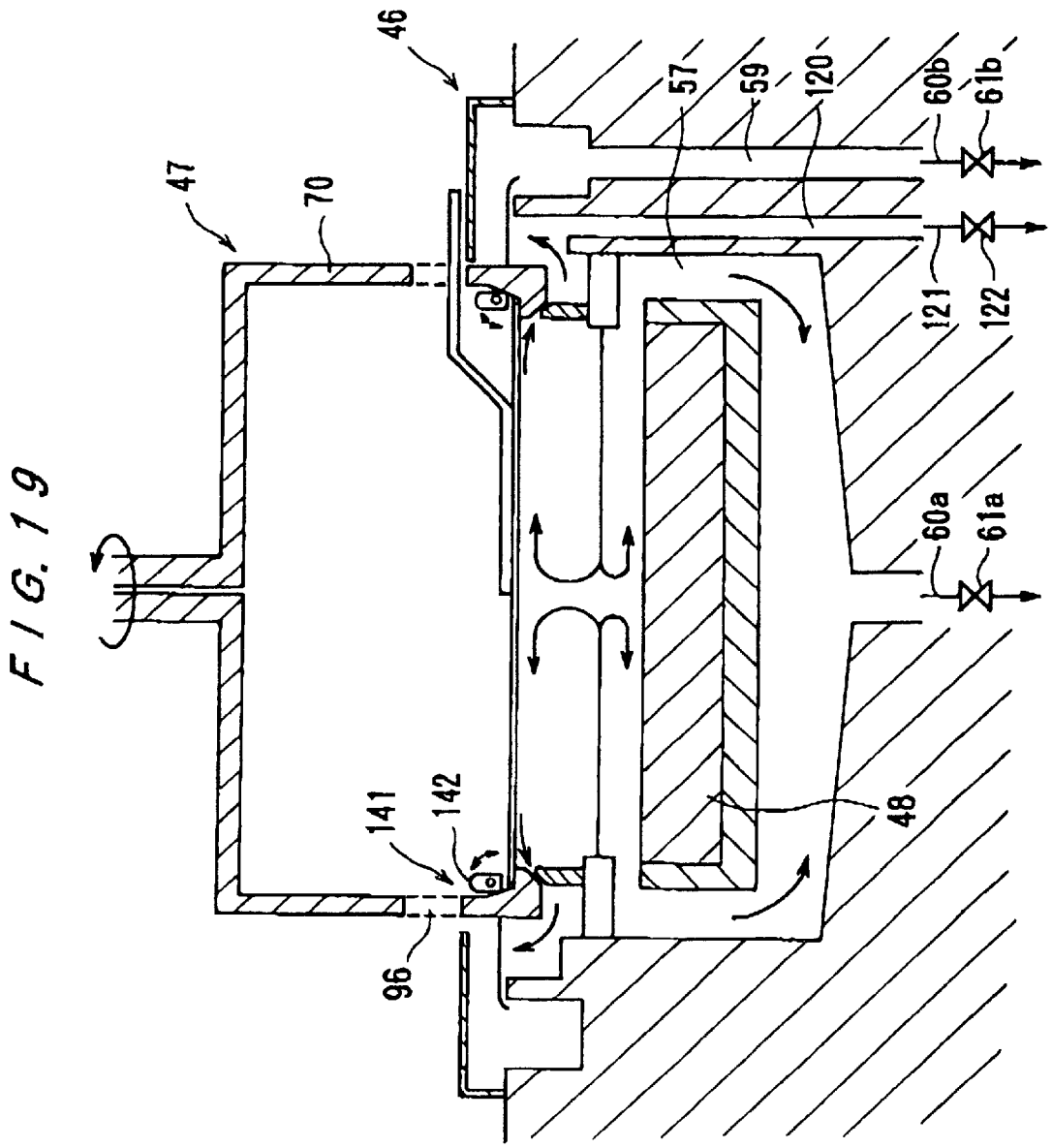
FIG. 19 is a cross-sectional view schematically showing a plating unit in a plating apparatus according to a fifth embodiment of the present invention.

FIG. 19 shows a plating unit in the plating apparatus according to the fifth embodiment of the present invention. The construction of this embodiment is substantially the same as that of the third embodiment, except that a clamp mechanism 141 having swing links 142 is used, instead of the substrate table 71 constituting a pressing member for pressing the substrate against the substrate holding member in the third embodiment, and the clamp mechanism 141 is housed within the housing 70 in its lower part.

According to this embodiment, when the swing links 142 are swung inward through the clamp mechanism 141 so as to be located in the horizontal direction, the peripheral portion of the substrate is sandwiched between the substrate holding member 72 of the housing 70 and the swing links 142, and hence the substrate W is held. When the swing links 142 are swung outward so as to be located in the vertical direction, the substrate is released. At the same time, it is possible to prevent the swing links 142 from hindering the withdrawal of the substrate W.

Figure 20:
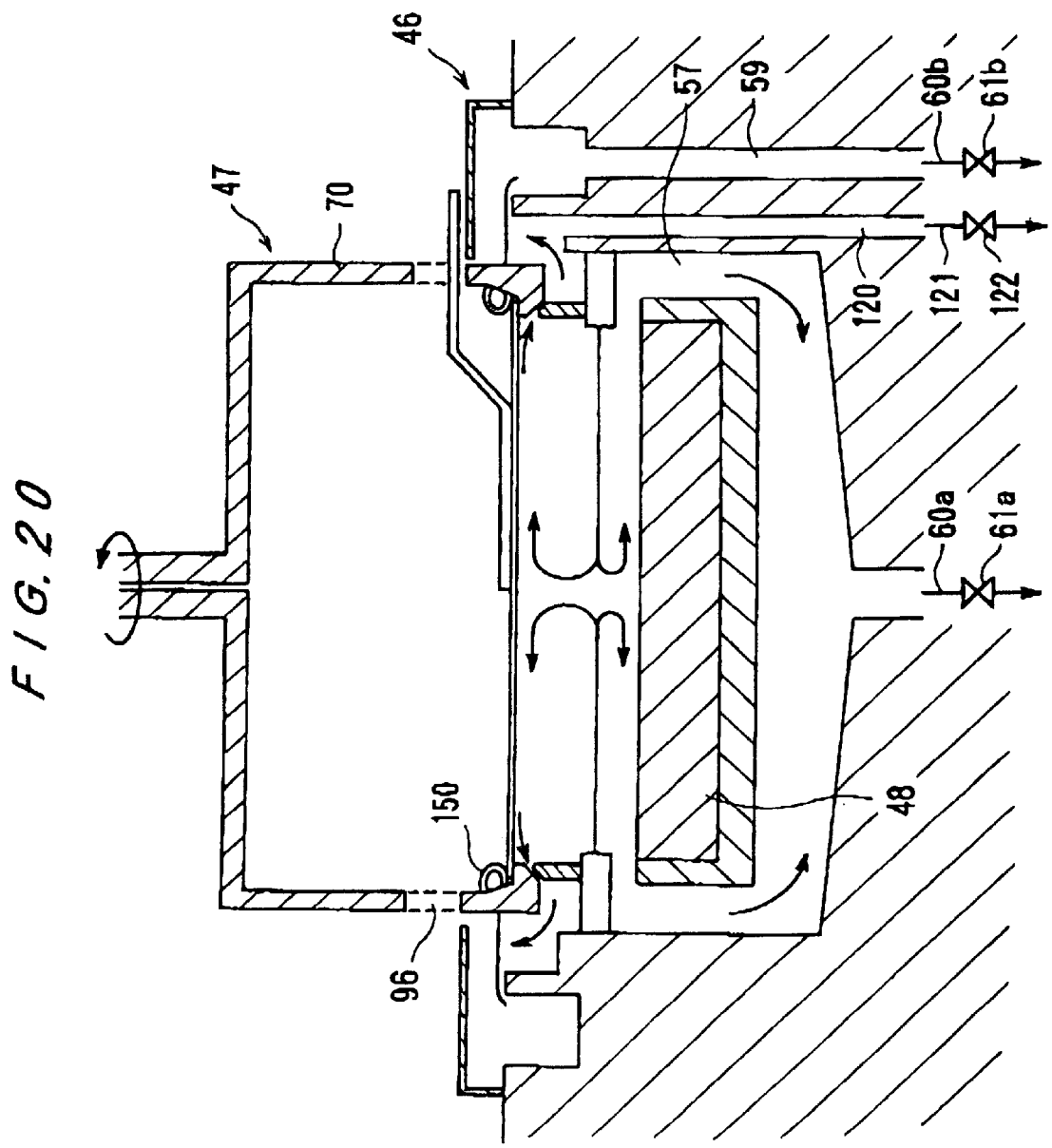
FIG. 20 is a cross-sectional view schematically showing a plating unit in a plating apparatus according to a sixth embodiment of the present invention.

FIG. 20 shows a plating unit in the plating apparatus according to the sixth embodiment of the present invention. The construction of this embodiment is substantially the same as that of the third embodiment, except that an elastic member 150 which is elastically deformable, i.e., expandable or contractable by pneumatic pressure is used, instead of the substrate table 71 constituting a pressing member for pressing the substrate against the substrate holding member in the third embodiment. This elastic member 150 is housed within the housing 70 in its lower part.

According to this embodiment, by expanding the elastic member 150 by pneumatic pressure, the peripheral portion of the substrate is sandwiched between the substrate holding member 72 of the housing 70 and the elastic member 150, and hence the substrate W is held. The substrate can be released by discharging air from the elastic member 150. At the same time, it is possible to prevent the elastic member 150 from hindering the withdrawal of the substrate W.

Figure 21:
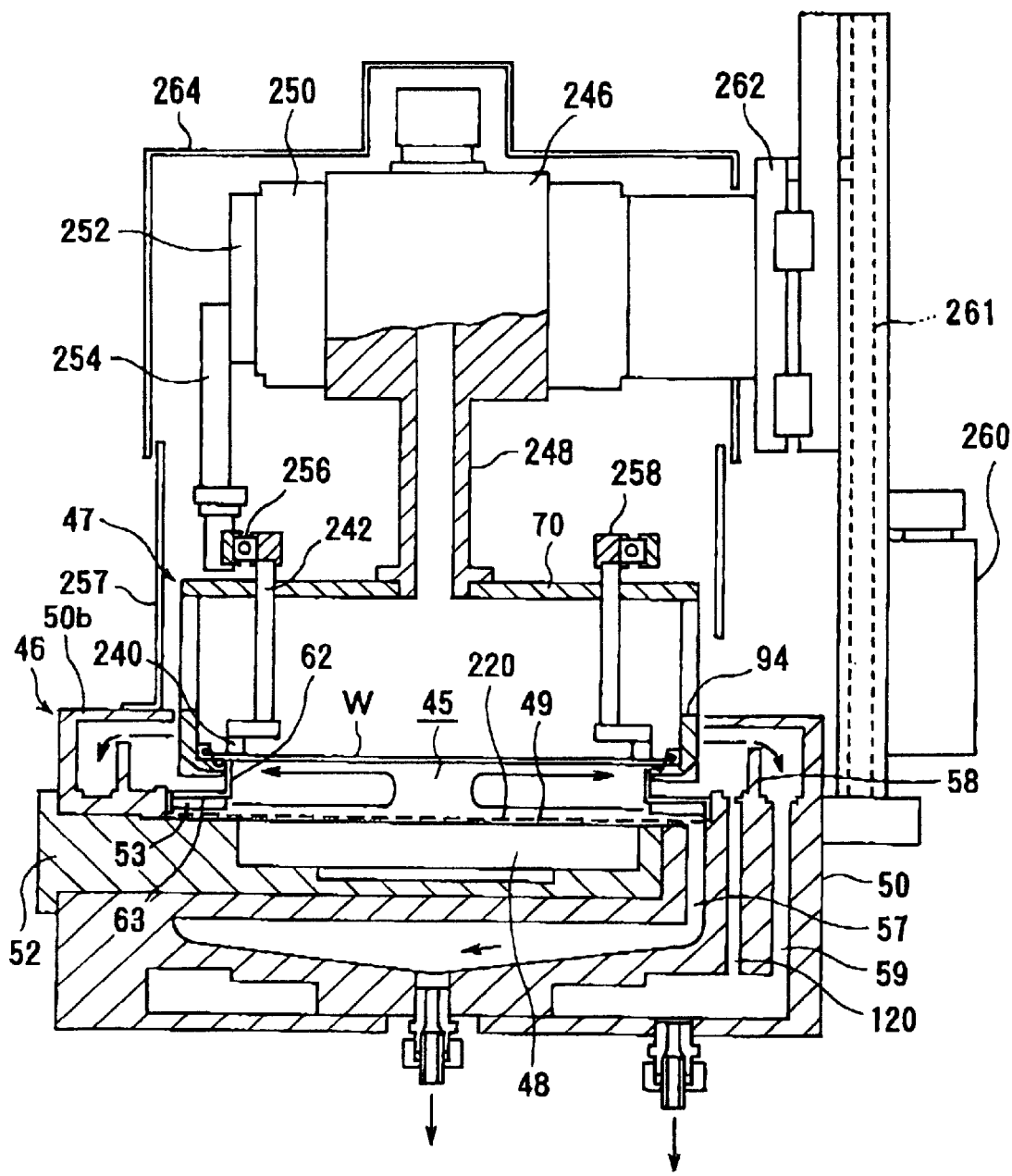
FIG. 21 is a cross-sectional view showing a whole structure of a plating unit at the time of plating process in a plating apparatus according to a seventh embodiment of the present invention.

FIG. 21 shows the whole construction of a plating unit in the plating apparatus according to the seventh embodiment of the present invention. FIG. 22 shows a flow diagram of a plating solution in a plating apparatus having a plurality of the plating units. The parts or components identical to or corresponding to the parts or components in the plating units according to the above embodiments are denoted by the same reference numerals, and a part of the explanation thereof will be omitted.

As shown in FIG. 21, the plating unit is composed mainly of a plating process container 46 which is substantially cylindrical and contains a plating solution 45 therein, and a head 47 disposed above the plating process container 46 for holding the substrate W. In FIG. 21, the plating unit is in such a state that the substrate W is held by the head 47 and the surface of the plating solution 45 is on the liquid level for plating.

The plating process container 46 has a plating chamber 49 which is open upward and has an anode 48 at the bottom thereof. A plating container 50 containing the plating solution 45 is provided within the plating chamber 49. Plating solution supply nozzles 53, which project horizontally toward the center of the plating chamber 49, are disposed at circumferentially equal intervals on the inner circumferential wall of the plating container 50. The plating solution supply nozzles 53 communicate with plating solution supply passages 54 (see FIG. 4) extending vertically within the plating container 50.

As shown in FIG. 22, the plating solution supply passages 54 are connected to the plating solution regulating tank 40 (see FIG. 3) through the plating solution supply pipes 55. Control valves 56 for controlling the back pressure so as to be constant are disposed on each of the plating solution supply pipes 55.

Further, according to this embodiment, a punch plate 220 having a large number of holes with a size of, for example, about 3 mm is disposed at a position above the anode 48 within the plating chamber 49. The punch plate 220 prevents a black film formed on the surface of the anode 48 from curling up due to the plating solution 45 and consequently being flowed out.

The plating container 50 has first plating solution discharge ports 57 for withdrawing the plating solution 45 contained in the plating chamber 49 from the peripheral portion of the bottom in the plating chamber 49, and second plating solution discharge ports 59 for discharging the plating solution 45 which has overflowed a weir member 58 provided at the upper end of the plating container 50. Further, the plating container 50 has third plating solution discharge ports 120 for discharging the plating solution before overflowing the weir member 58. The plating solution which has flowed through the second plating solution discharge ports 59 and the third plating solution discharge ports 120 join at the lower end of the plating container 50, and then is discharged from the plating container. Instead of providing the third plating solution discharge ports 120, as shown in FIGS. 27A through 27D, the weir member 58 may have, in its lower part, openings 222 having a predetermined width at predetermined intervals so that the plating solution 45 passes through the openings 222 and is then discharged to the second plating solution discharge ports 59.

With this arrangement, when the amount of plating solution supplied is large during plating, the plating solution is discharged to the exterior through the third plating solution discharge ports 120 or is passed through the openings 222 and discharged to the exterior through the second plating solution discharge ports 59 and, in addition, as shown in FIG. 27A, the plating solution overflows the weir member 58 is discharged to the exterior through the second plating solution discharge ports 59. On the other hand, during plating, when the amount of plating solution supplied is small, the plating solution is discharged to the exterior through the third plating solution discharge ports 120, or alternatively as shown in FIG. 27B, the plating solution is passed through the openings 222 and discharged to the exterior through the second plating solution discharge ports 59. In this manner, this construction can easily cope with the case where the amount of plating solution supplied is large or small.

Further, as shown in FIG. 27D, through holes 224 for controlling the liquid level, which are located above the plating solution supply nozzles 53 and communicate with the plating chamber 49 and the second plating solution discharge ports 59, are provided at circumferentially predetermined pitches. Thus, when plating is not performed, the plating solution is passed through the through holes 224, and is discharged to the exterior through the second plating solution discharge ports 59, thereby controlling the liquid level of the plating solution. During plating, the through holes 224 serve as an orifice for restricting the amount of the plating solution flowing therethrough.

As shown in FIG. 22, the first plating solution discharge ports 57 are connected to the reservoir 226 through the plating solution discharge pipe 60a, and a flow controller 61a is provided in the plating solution discharge pipe 60a. The second plating solution discharge ports 59 and the third plating solution discharge ports 120 join with each other within the plating container 50, and the joined passage is then connected directly to the reservoir 226 through the plating solution discharge pipe 60b.

The reservoir 226 is constructed so that the the reservoir 226. The plating solution which has flowed into the reservoir 226 is introduced by a pump 228 into the plating solution regulating tank 40 (see FIG. 3). This plating solution regulating tank 40 is provided with a temperature controller 230, and a plating solution analyzing unit 232 for sampling the plating solution and analyzing the sample solution. When a single pump 234 is operated, the plating solution is supplied from the plating solution regulating tank 40 through the filter 236 to the plating solution supply nozzles 53 in each of the plating units. A control valve 56 is provided in the plating solution supply pipe 55 extending from the plating solution regulating tank 40 to each of the plating units. This control valve 56 serves to make the pressure on the secondary side constant, and, even when one plating unit is stopped, the control valve 56 can make the supply pressure of the plating solution in the other plating units constant.

Thus, a plating solution prepared in a plating solution regulating tank 40 in a single plating process system is fed to a plurality of plating units through a single pump 234. The plating solution preparation tank 40 having a large capacity is used in the plating process system to prepare a plating solution. With this arrangement, the plating solution is fed to each of the plating units while controlling the flow rate in each of the plating units through control valves 56, and a variation in quality of the plating solution can be suppressed.

A vertical stream regulating ring 62 and a horizontal stream regulating ring 63 are disposed within the plating chamber 49 at a position near the internal circumference of the plating chamber 49, and the central portion of the liquid surface is pushed up by an upward stream out of two divided upward and downward streams of the plating solution 45 within the plating chamber 49, whereby the downward flow is smoothened and the distribution of the current density is further made uniform. The horizontal stream regulating ring 63 has a peripheral portion which is fixed to the plating container 50, and the vertical stream regulating ring 62 is connected to the horizontal stream regulating ring 63.

Figure 26:
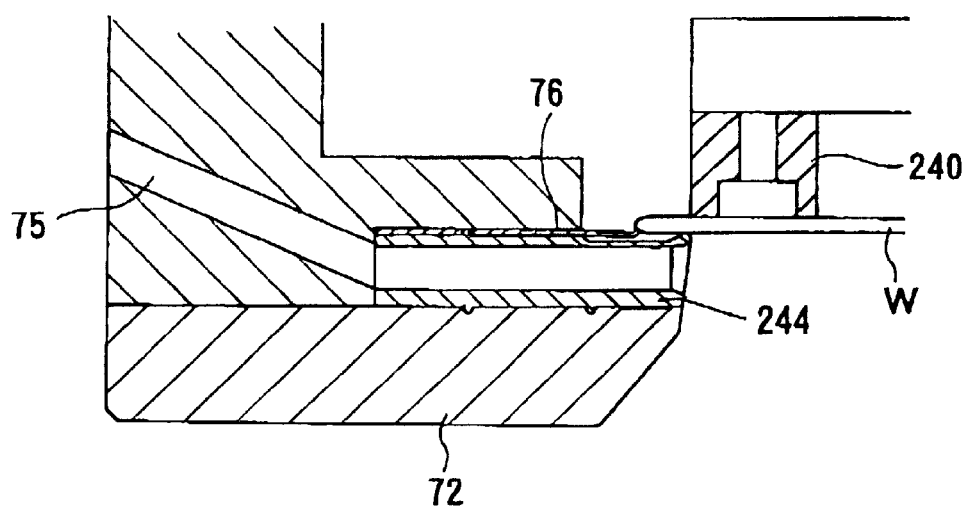
FIG. 26 is an enlarged view showing a part of FIG. 25.

On the other hand, the head 47 comprises a housing 70 which is a rotatable and cylindrical receptacle having a downwardly open end and has openings 96 on the circumferential wall, and vertically movable rods 242 having, at their lower end, a pressing ring 240. As shown in FIG. 26, an inwardly projecting ring-shaped substrate holding member 72 is provided at the lower end of the housing 70. A ring-shaped sealing member 244 is mounted on the substrate holding member 72. The ring-shaped sealing member 244 projects inward, and the front end of the top surface in the ring-shaped sealing member 244 projects upward in an annular tapered form. Further, contacts 76 for a cathode electrode are disposed above the sealing member 244. Air vent holes 75, which extend outwardly in the horizontal direction and further extend outwardly in an upwardly inclined state, are provided in the substrate holding member 72 at circumferentially equal intervals. The contacts 76 for a cathode electrode and the air vent holes 75 are the same as those in the first embodiment.

Figure 23:
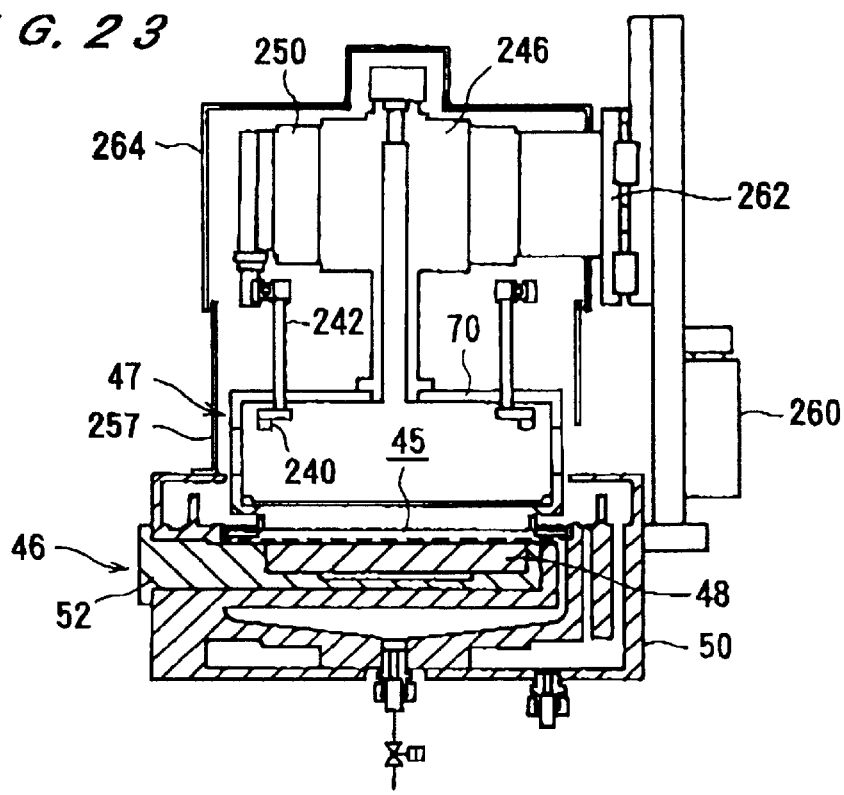
FIG. 23 is a cross-sectional view showing a whole structure of the plating unit during a non-plating process (at the time of transfer of a substrate)
Figure 25:
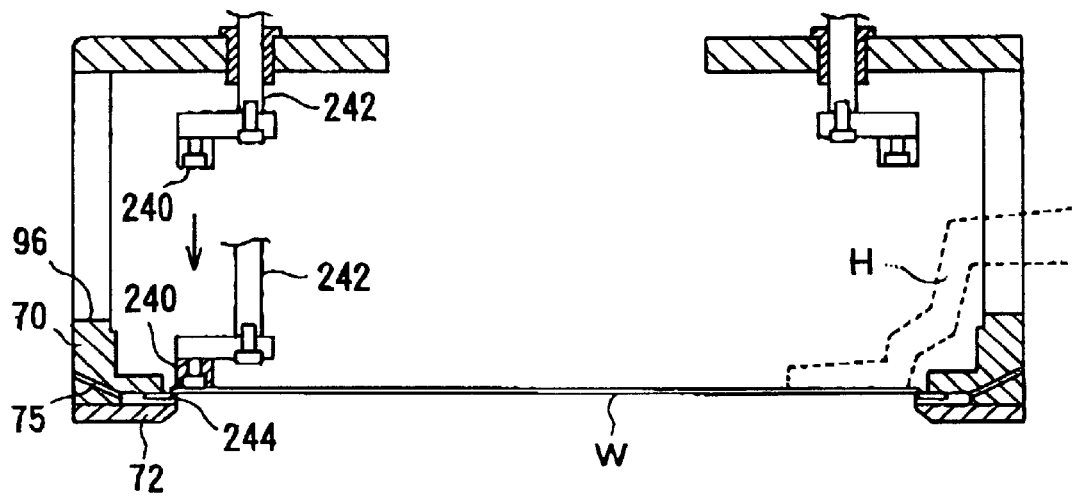
FIG. 25 is a cross-sectional view explanatory of a relationship among a housing, a pressure ring, and a substrate during transfer of a substrate.

With this arrangement, as shown in FIG. 23, the liquid level of the plating solution is lowered, and as shown in FIGS. 25 and 26, the substrate W is held by a robot hand H or the like, and inserted into the housing 70 where the substrate W is placed on the upper surface of the sealing member 244 of the substrate holding member 72. Thereafter, the robot hand H is withdrawn from the housing 70, and the pressing ring 240 is then lowered to sandwich the peripheral portion of the substrate W between the sealing member 244 and the lower surface of the pressing ring 240, thereby holding the substrate W. In addition, upon holding of the substrate W, the lower surface of the substrate W is brought into pressure contact with the sealing member 244 to seal this contact portion positively. At the same time, current flows between the substrate W and the contacts 76 for a cathode electrode.

Returning to FIG. 21, the housing 70 is connected to an output shaft 248 of a motor 246, and rotated by energization of the motor 246. The pressing rods 242 are vertically provided at predetermined positions along the circumferential direction of a ring-shaped support frame 258 rotatably mounted through a bearing 256 on the lower end of a slider 254. The slider 254 is vertically movable by actuation of a cylinder 252, with a guide, fixed to a support 250 surrounding the motor 246. With this construction, the pressing rods 242 are vertically movable by the actuation of the cylinder 252, and, in addition, upon the holding of the substrate W, the pressing rods 242 are rotated integrally with the housing 70.

The support 250 is mounted on a slide base 262 which is vertically movable by a ball screw 261 rotated by energization of the motor 260. The support 250 is surrounded by an upper housing 264, and is vertically movable together with the upper housing 264 by energization of the motor 260. Further, a lower housing 257 for surrounding the housing 70 during plating is mounted on the upper surface of the plating container 50.

Figure 24:
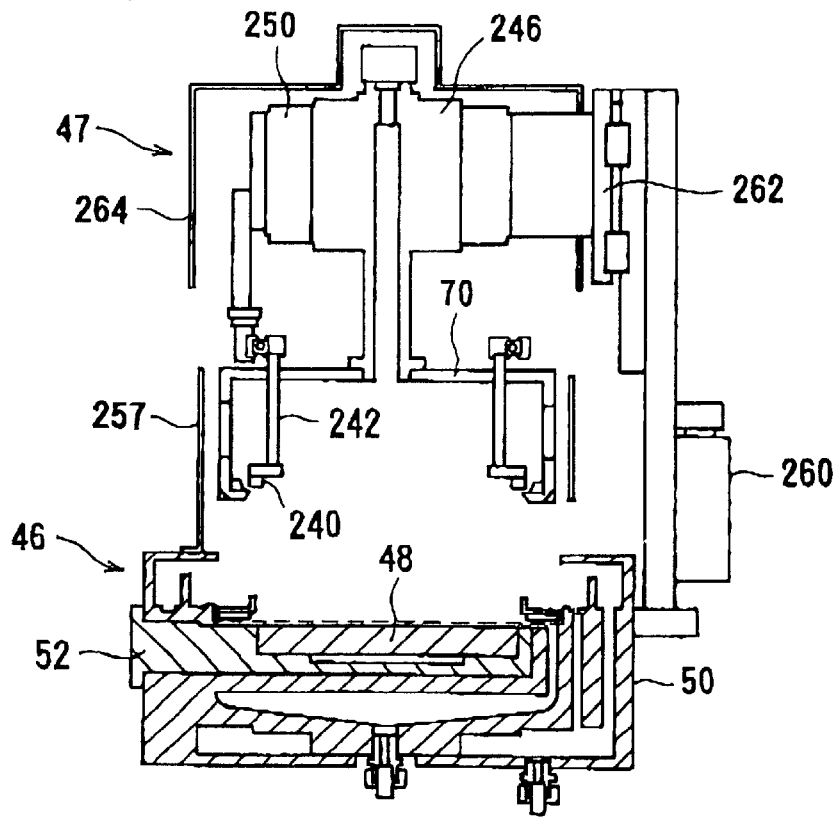
FIG. 24 is a cross-sectional view showing a whole structure of the plating unit during maintenance.

With this construction, as shown in FIG. 24, maintenance can be performed in such a state that the support 250 and the upper housing 264 are raised. A crystal of the plating solution is likely to deposit on the inner circumferential surface of the weir member 58. However, when the support 250 and the upper housing 264 are raised, a large amount of the plating solution is made to flow and overflows the weir member 58, and hence the crystal of the plating solution is prevented from being deposited on the inner circumferential surface of the weir member 58. A cover 50b for preventing the splash of the plating solution is integrally provided in the plating container 50 to cover a portion above the plating solution which overflows during plating process. By coating an ultra-water-repellent material such as HIREC (manufactured by NTT Advance Technology) on the lower surface of the cover 50b for preventing the splash of the plating solution, the crystal of the plating solution can be prevented from being deposited on the cover 50b.

Substrate centering mechanisms 270 located above the substrate holding member 72 of the housing 70 for performing centering of the substrate W, are provided at four places along the circumferential direction in this embodiment (see FIG. 30).

FIG. 28 shows the substrate centering mechanism 270 in detail. The substrate centering mechanism 270 comprises a gate-like bracket 272 fixed to the housing 70, and a positioning block 274 disposed within the bracket 272. This positioning block 274 is swingably mounted through a support shaft 276 horizontally fixed to the bracket 272. Further, a compression coil spring 278 is interposed between the housing 70 and the positioning block 274. Thus, the positioning block 274 is urged by the compression coil spring 278 so that the positioning block 274 rotates about the support shaft 276 and the lower portion of the positioning block 274 projects inwardly. The upper surface 274a of the positioning block 274 serves as a stopper, and is brought into contact with the lower surface 272a of the bracket 272 to restrict the movement of the positioning block 274. Further, the positioning block 274 has a tapered inner surface 274b which is widened outward in the upward direction.

With this construction, a substrate is held by the hand of a transfer robot or the like, is carried into the housing 70, and is placed on the substrate holding member 72. In this case, when the center of the substrate deviates from the center of the substrate holding member 72, the positioning block 274 is rotated outwardly against the urging force of the compression coil spring 278 and, upon the release of holding of the substrate from the hand of the transfer robot or the like, the positioning block 274 is returned to the original position by the urging force of the compression coil spring 278. Thus, the centering of the substrate can be carried out.

FIG. 29 shows a feeding contact (a probe) 77 for feeding power to a cathode electrode plate 208 of a contact 76 for a cathode electrode (see FIG. 7). This feeding contact 77 is composed of a plunger and is surrounded by a cylindrical protective member 280 extending to the cathode electrode plate 208, whereby the feeding contact 77 is protected against the plating solution.

In this case, when plating process is carried out, an annular projecting portion projecting from the inner circumferential surface of the sealing member 244, is pressed against the surface, to be plated, of the substrate. The inner side of the annular projecting portion is filled with the plating solution. Therefore, the plating solution remains in the tip end of the annular projecting portion. This plating solution, upon drying, becomes a source for particles. For this reason, in this embodiment, a plating solution suction mechanism 300 is provided for removing the plating solution remaining in the tip end of the annular projecting portion of the sealing member 244.

FIGS. 30 and 31 show this plating solution suction mechanism 300. The plating solution suction mechanism 300 has a plating solution suction nozzle 302 extending in an arc form, for example, having a central angle of about 100°, along the annular projecting portion on the inner circumferential surface of the sealing member 244. This plating solution suction nozzle 302 is connected through a block 306 to the lower end of a plating solution suction pipe 304 which has a plating solution passage 304a therein and is bent at a right angle from the vertical direction and extends in the horizontal direction. The other end of the plating solution suction pipe 304 is connected to a flexible pipe 312 extending from a vacuum source 310.

The plating solution suction pipe 304 is connected to a horizontal slider 316 which is moved horizontally by actuating a cylinder 314 for horizontal movement. Further, the cylinder 314 for horizontal movement is connected through a hooked bracket 322 to a vertical slider 320 which is vertically moved by actuating a cylinder 318 for vertical movement. Further, the cylinder 318 for vertical movement is mounted on the support 250. Therefore, the plating solution suction nozzle 302 is vertically and horizontally movable.

In the case where the plating solution remaining in the tip end of the annular projecting portion of the sealing member 244 is sucked and removed by the plating solution suction mechanism 300, the cylinder 314 for horizontal movement is first actuated to advance the plating solution suction nozzle 302 toward the housing 70, and to introduce the plating solution suction nozzle 302 into the housing 70 through the opening 96 of the housing 70. Thereafter, the cylinder 318 for vertical movement is actuated to lower the plating solution suction nozzle 302. Thus, the plating solution suction nozzle 302 approaches to and faces the tip end of the annular projecting portion of the sealing member 244. In this state, while the housing 70 is slowly rotated about a vertical axis, suction by the vacuum source 310 is performed to remove the plating solution remaining on the half of the entire annular tip end of the annular projecting portion of the sealing member 244. Thereafter, in the reverse operation, the plating solution suction nozzle 302 is withdrawn from the housing 70. The housing 70 is rotated about the vertical axis by 180 degrees. Thereafter, in the same manner as described above, the plating solution suction nozzle 302 approaches to and faces the tip end of the annular projecting portion of the sealing member 244. In this state, suction by the vacuum source 310 is performed to remove the plating solution remaining on the remaining half of the annular tip end of the annular projecting portion of the sealing member 244.

Thus, the plating solution left on the tip end of the annular projecting portion of the sealing member 244 can be sucked and removed in a short time with high efficiency, thus preventing the plating solution from becoming a source for particles.

In the plating apparatus according to this embodiment, as with the third embodiment, when the surface of the plating solution is on a low level for transferring the substrate as shown in FIG. 23, the substrate is inserted into and held within the housing 70. In this state, the liquid level of the plating solution is raised and the substrate is plated. Thereafter, the liquid level of the plating solution is lowered, and the plated substrate is withdrawn from the housing 70. After the substrate is withdrawn from the housing 70, if necessary, the plating solution remaining on the tip end of the annular projecting portion of the sealing member 244 is sucked and removed by the plating solution suction mechanism 300. Further, maintenance is carried out in such a state that the support 250 and the upper housing 264 are raised. In this state, if necessary, a large amount of the plating solution is made to flow and overflows the weir member 58, thereby preventing a crystal of the plating solution from being deposited on the inner circumferential surface of the weir member 58.

Further, in this embodiment, the following process may be performed: When the surface of the plating solution is on the liquid level B for transferring the substrate, the substrate W is inserted into the housing 70 and held by the housing 70, and then the liquid level of the plating solution is raised to the liquid level A for plating. At the same time, the housing 70 is raised by a certain distance. After the liquid level of the polishing solution reaches the liquid level A for plating, the housing 70 is rotated at a medium speed of, for example, 150 $min^{-1}$ and lowered, whereby the substrate W is brought into contact with the surface of the plating solution which rises at its central portion. Thus, air bubbles on the surface of the substrate can be positively removed therefrom.

In the above embodiments, a pre-dipping process is employed in the pre-treatment unit, and a pre-treatment liquid (a pre-dipping liquid) which is one component of the plating solution is uniformly coated to improve adhesive property of plating on the surface, to be plated, of the substrate on which a barrier layer and a seed layer are successively provided. Alternatively, a pre-plating method in which a pre-plating is applied to reinforce an incomplete seed layer onto the surface, to be plated, of the substrate on which a barrier layer and a seed layer are successively provided may be used.

The pre-plating unit using the pre-plating method may have substantially the same structure as the plating unit, a weakly alkaline and highly polarized solution of copper pyrophosphate is used as the plating solution, and pure copper (oxygen-free copper) is used as the anode. Instead of the pre-treatment unit 21 employing the pre-dipping method shown in FIG. 2, the pre-plating unit having the above construction may be used, the pre-plating may be carried out to reinforce the incomplete seed layer, and then a process may be shifted to plating. Further, both of the pre-treatment unit and the pre-plating unit may be provided within the plating apparatus.

Since the plating solution used in the pre-plating unit is alkaline and the plating solution used in the plating unit is acid, it is necessary not to bring alkali plating solution attached to the substrate in the pre-plating unit into the plating unit. Therefore, a cleaning device may be provided in the plating section 12 (see FIG. 2) to clean the substrate, which has been subjected to the pre-plating process in the pre-plating unit, with water, and the cleaned substrate may be transferred to the plating unit in which plating of the substrate is performed. In the arrangement shown in FIG. 2, at least one of the plating unit (plating units) 22 and the pre-treatment units 21 may be replaced with a pre-plating unit, and at least one of the pre-treatment units 21 may be replaced with the above cleaning device.

As is apparent from the foregoing description, according to the present invention, units (piece of equipment) for continuously performing plating processes and processes incidental to the plating process are efficiently disposed in the same system to reduce an installation area of the system.

Further, it is possible to perform a series of treatments, wherein a substrate is taken out from a cassette, is subjected to a pre-treatment process and a plating process, and is then rinsed with pure water and dried, in the same system in a continuous and efficient manner. In addition, the contamination of a substrate with a chemical used in the plating process or the like can be prevented.

Although certain preferred embodiments of the present invention have been shown and described in detail, it should be understood that various changes and modifications may be made therein without departing from the scope of the appended claims.

What is claimed is:

1. A plating unit comprising:
   a rotatable housing having a substrate holding member provided at the lower end thereof, said substrate holding member projecting radially inwardly and adapted to abut a peripheral portion of a substrate to hold the substrate; and
   a pressing member disposed in said housing for pressing the peripheral portion of the substrate against said substrate holding member to hold the substrate, said pressing member being rotatable together with said housing.

2. A plating unit according to claim 1, wherein a plurality of air vent holes are formed in said substrate holding member provided at the lower end of said housing.

3. A plating unit according to claim 1, wherein said pressing member comprises a chuck mechanism disposed at the peripheral portion thereof for detachably holding the substrate on the lower surface of said pressing member.

4. A plating unit according to claim 1, wherein a contact for a cathode electrode is disposed on said substrate holding member of said housing;
- a feeding contact is disposed at the outer circumferential side of said pressing member;
- said contact for said cathode electrode is energized when a substrate is held by said substrate holding member and said pressing member; and
- said feeding contact energizes said contact for said cathode electrode when said pressing member is lowered to bring said contact for said cathode electrode into contact with said feeding contact.

5. A plating unit comprising:
- a head having a rotatable housing;
- a vertically movable pressing member housed in said housing;
- a substrate holding member disposed in said housing for holding a peripheral portion of a substrate between said pressing member and said substrate holding member; and
- a plating process container disposed below said head for holding a plating solution so that the liquid surface of said plating solution has a liquid level for plating which is higher than a position of a substrate held by said housing, and a liquid level for transferring the substrate which is lower than a position of a substrate held by said housing.

6. A plating unit comprising:
- a head having a rotatable housing;
- a vertically movable pressing ring housed in said housing;
- a substrate holding member disposed in said housing for holding a peripheral portion of a substrate between said pressing ring and said substrate holding member; and
- a plating process container disposed below said head for holding a plating solution so that the liquid surface of said plating solution has a liquid level for plating which is higher than a position of a substrate held by said housing, and a liquid level for transferring the substrate which is lower than a position of a substrate held by said housing.

7. A plating unit comprising:
- a head having a rotatable housing;
- a clamp mechanism with a swing link housed in said housing, said swing link being swingable in the horizontal direction;
- a substrate holding member disposed in said housing for holding a peripheral portion of a substrate between said swing link and said substrate holding member; and
- a plating process container disposed below said head for holding a plating solution so that the liquid surface of said plating solution has a liquid level for plating which is higher than a position of a substrate held by said housing, and a liquid level for transferring the substrate which is lower than a position of a substrate held by said housing.

8. A plating unit comprising:
- a head having a rotatable housing, said housing having an elastic member therein elastically deformable by pneumatic pressure;
- a substrate holding member disposed in said housing for holding a peripheral portion of a substrate between said elastic member and said substrate holding member; and
- a plating process container disposed below said head for holding a plating solution so that the liquid surface of said plating solution has a liquid level for plating which is higher than a position of a substrate held by said housing, and a liquid level for transferring the substrate which is lower than a position of a substrate held by said housing.

9. A plating unit comprising:
- a head having a rotatable housing, said housing having a substrate holding member for holding a substrate; and
- a plating process container disposed below said head for holding a plating solution so that the liquid surface of said plating solution has at least two levels.

10. A plating unit comprising:
- a head having a substrate holding member for holding a substrate;
- a plating process container disposed below said head for holding a plating solution; and
- a plating solution suction mechanism for removing a plating solution remaining at a portion abutting on the peripheral portion of a substrate at the inner circumferential end of said substrate holding member.

* * * * *